(12) United States Patent
Rayner et al.

(10) Patent No.: US 9,871,248 B2
(45) Date of Patent: Jan. 16, 2018

(54) POROUS ELECTROACTIVE MATERIAL

(75) Inventors: Philip John Rayner, Huntingdon (GB); Melanie J. Loveridge, Abingdon (GB)

(73) Assignee: Nexeon Limited, Abingdon, Oxfordshire (GB)

( * ) Notice: Subject to any disclaimer, the term of this patent is extended or adjusted under 35 U.S.C. 154(b) by 767 days.

(21) Appl. No.: 13/820,223

(22) PCT Filed: Sep. 2, 2011

(86) PCT No.: PCT/GB2011/001298
§ 371 (c)(1), (2), (4) Date: May 2, 2013

(87) PCT Pub. No.: WO2012/028857
PCT Pub. Date: Mar. 8, 2012

(65) Prior Publication Data
US 2013/0216907 A1   Aug. 22, 2013

(30) Foreign Application Priority Data

Sep. 3, 2010   (GB) .................................. 1014706.4

(51) Int. Cl.
*H01M 4/04*   (2006.01)
*B22F 9/04*   (2006.01)
(Continued)

(52) U.S. Cl.
CPC .............. *H01M 4/386* (2013.01); *B22F 9/04* (2013.01); *C01B 33/02* (2013.01); *C30B 29/06* (2013.01);
(Continued)

(58) Field of Classification Search
CPC .................................................. H01M 4/134
(Continued)

(56) References Cited

U.S. PATENT DOCUMENTS 3,351,445 A   11/1967   Fielder et al.
4,002,541 A   1/1977   Streander
(Continued)

FOREIGN PATENT DOCUMENTS

| CN | 1447916 A | 10/2003 |
|---|---|---|
| CN | 1674325 A | 9/2005 |

(Continued)

OTHER PUBLICATIONS

Peng, K. et al., "Metal-Particle-Induced, Highly Localized Site-Specific Etching of Si and Formation of Single-Crystalline Si Nanowires in Aqueous Fluoride Solution", Chemistry A European Journal 2006, 12, pp. 7942-7947 (2006).

(Continued)

*Primary Examiner* — Matthew J Merkling
(74) *Attorney, Agent, or Firm* — McDonnell Boehnen Hulbert & Berghoff LLP

(57) ABSTRACT

A composition including a plurality of electroactive porous particle fragments including silicon as an electroactive material is characterized in that each porous particle fragment includes a network of pores defined and separated by silicon containing walls. The network of pores suitably has a three dimensional arrangement of pores extending through the volume of the particle in which the pore openings are provided on two or more planes over the surface of the particle. The composition is useful as an electroactive material that is able to form an alloy with lithium and can be used in the fabrication of anodes for use in lithium ion secondary batteries. A method of fabricating the silicon containing porous particle fragments is also disclosed.

40 Claims, 11 Drawing Sheets

(51) Int. Cl.
*C01B 33/02* (2006.01)
*C30B 29/06* (2006.01)
*C30B 29/60* (2006.01)
*H01M 4/38* (2006.01)
*H01M 4/134* (2010.01)
*H01M 4/02* (2006.01)

(52) U.S. Cl.
CPC .............. *C30B 29/60* (2013.01); *H01M 4/04* (2013.01); *H01M 4/134* (2013.01); *B22F 2999/00* (2013.01); *H01M 4/0404* (2013.01); *H01M 2004/021* (2013.01); *H01M 2004/027* (2013.01)

(58) Field of Classification Search
USPC ...................... 429/208–246; 29/623.1–623.5
See application file for complete search history.

(56) References Cited

U.S. PATENT DOCUMENTS

| | | |
|---|---|---|
| 4,436,796 A | 3/1984 | Huggins et al. |
| 4,950,566 A | 8/1990 | Huggins et al. |
| 5,260,148 A | 11/1993 | Idota |
| 5,262,021 A | 11/1993 | Lehmann et al. |
| 5,660,948 A | 8/1997 | Barker |
| 5,907,899 A | 6/1999 | Dahn et al. |
| 5,980,722 A | 11/1999 | Kuroda et al. |
| 6,022,640 A | 2/2000 | Takada et al. |
| 6,042,969 A | 3/2000 | Yamada et al. |
| 6,063,995 A | 5/2000 | Bohland et al. |
| 6,190,951 B1 | 2/2001 | Nakahori et al. |
| 6,235,427 B1 | 5/2001 | Idota et al. |
| 6,296,969 B1 | 10/2001 | Yano et al. |
| 6,334,939 B1 | 1/2002 | Zhou et al. |
| 6,337,156 B1 | 1/2002 | Narang et al. |
| 6,353,317 B1 | 3/2002 | Green et al. |
| 6,399,177 B1 | 6/2002 | Fonash et al. |
| 6,399,246 B1 | 6/2002 | Vandayburg et al. |
| 6,589,696 B2 | 7/2003 | Matsubara et al. |
| 6,605,386 B1 | 8/2003 | Kasamatsu et al. |
| 6,620,547 B1 | 9/2003 | Sung et al. |
| 6,887,511 B1 | 5/2005 | Shima et al. |
| 6,916,679 B2 | 7/2005 | Snyder et al. |
| 7,033,936 B1 | 4/2006 | Green |
| 7,051,945 B2 | 5/2006 | Empedocles et al. |
| 7,070,632 B1 | 7/2006 | Visco et al. |
| 7,094,499 B1 | 8/2006 | Hung |
| 7,147,894 B2 | 12/2006 | Zhou et al. |
| 7,192,673 B1 | 3/2007 | Ikeda et al. |
| 7,311,999 B2 | 12/2007 | Kawase et al. |
| 7,318,982 B2 | 1/2008 | Gozdz et al. |
| 7,348,102 B2 | 3/2008 | Li et al. |
| 7,358,011 B2 | 4/2008 | Fukuoka et al. |
| 7,378,041 B2 | 5/2008 | Asao et al. |
| 7,425,285 B2 | 9/2008 | Asao et al. |
| 7,476,469 B2 | 1/2009 | Ota et al. |
| 7,569,202 B2 | 8/2009 | Farrell et al. |
| 7,659,034 B2 | 2/2010 | Minami et al. |
| 7,674,552 B2 | 3/2010 | Nakai et al. |
| 7,767,346 B2 | 8/2010 | Kim et al. |
| 7,862,933 B2 | 1/2011 | Okumura et al. |
| 7,879,734 B2 | 2/2011 | Fukutani et al. |
| 8,034,485 B2 | 10/2011 | Dahn et al. |
| 8,585,918 B2 | 11/2013 | Green et al. |
| 8,597,831 B2 | 12/2013 | Green et al. |
| 8,772,174 B2 | 7/2014 | Green et al. |
| 2001/0023986 A1 | 9/2001 | Mancevski |
| 2002/0074972 A1 | 6/2002 | Narang et al. |
| 2002/0086211 A1* | 7/2002 | Umeno ............... H01M 4/0428 429/231.4 |
| 2002/0148727 A1 | 10/2002 | Zhou et al. |
| 2003/0135989 A1 | 7/2003 | Huggins et al. |
| 2004/0072067 A1 | 4/2004 | Minami et al. |
| 2004/0126659 A1 | 7/2004 | Graetz et al. |
| 2004/0151987 A1 | 8/2004 | Kawase et al. |
| 2004/0166319 A1 | 8/2004 | Li et al. |
| 2004/0185346 A1 | 9/2004 | Takeuchi et al. |
| 2004/0197660 A1 | 10/2004 | Sheem et al. |
| 2004/0214085 A1 | 10/2004 | Sheem et al. |
| 2004/0224231 A1 | 11/2004 | Fujimoto et al. |
| 2004/0241548 A1 | 12/2004 | Nakamoto et al. |
| 2005/0042515 A1 | 2/2005 | Hwang et al. |
| 2005/0079414 A1 | 4/2005 | Yamamoto et al. |
| 2005/0079420 A1 | 4/2005 | Cho et al. |
| 2005/0118503 A1 | 6/2005 | Honda et al. |
| 2005/0191550 A1 | 9/2005 | Satoh et al. |
| 2005/0193800 A1 | 9/2005 | DeBoer et al. |
| 2005/0214644 A1 | 9/2005 | Aramata et al. |
| 2006/0003226 A1 | 1/2006 | Sawa et al. |
| 2006/0019115 A1 | 1/2006 | Wang et al. |
| 2006/0019168 A1 | 1/2006 | Li et al. |
| 2006/0024582 A1 | 2/2006 | Li et al. |
| 2006/0051670 A1 | 3/2006 | Aramata et al. |
| 2006/0057463 A1 | 3/2006 | Gao et al. |
| 2006/0088767 A1 | 4/2006 | Li et al. |
| 2006/0097691 A1* | 5/2006 | Green ................... H01M 4/134 320/107 |
| 2006/0134516 A1 | 6/2006 | Im et al. |
| 2006/0134518 A1 | 6/2006 | Kogetsu et al. |
| 2006/0147800 A1 | 7/2006 | Sato et al. |
| 2006/0154071 A1 | 7/2006 | Homma et al. |
| 2006/0166093 A1 | 7/2006 | Zaghib et al. |
| 2006/0175704 A1 | 8/2006 | Shimizu et al. |
| 2006/0257307 A1 | 11/2006 | Yang |
| 2006/0263687 A1 | 11/2006 | Leitner et al. |
| 2006/0275663 A1 | 12/2006 | Matsuno et al. |
| 2006/0275668 A1 | 12/2006 | Peres et al. |
| 2006/0286448 A1 | 12/2006 | Snyder et al. |
| 2007/0003835 A1 | 1/2007 | Hasegawa et al. |
| 2007/0026313 A1 | 2/2007 | Sano |
| 2007/0031733 A1 | 2/2007 | Kogetsu et al. |
| 2007/0037063 A1 | 2/2007 | Choi et al. |
| 2007/0048609 A1 | 3/2007 | Ueda et al. |
| 2007/0059598 A1 | 3/2007 | Yang |
| 2007/0065720 A1 | 3/2007 | Hasegawa et al. |
| 2007/0072074 A1 | 3/2007 | Yamamoto et al. |
| 2007/0087268 A1 | 4/2007 | Kim et al. |
| 2007/0099084 A1 | 5/2007 | Huang et al. |
| 2007/0099085 A1 | 5/2007 | Choi et al. |
| 2007/0105017 A1 | 5/2007 | Kawase et al. |
| 2007/0117018 A1 | 5/2007 | Huggins |
| 2007/0122702 A1 | 5/2007 | Sung et al. |
| 2007/0148544 A1 | 6/2007 | Le |
| 2007/0172732 A1 | 7/2007 | Jung et al. |
| 2007/0184345 A1 | 8/2007 | Neudecker et al. |
| 2007/0190413 A1 | 8/2007 | Lee et al. |
| 2007/0202395 A1 | 8/2007 | Snyder et al. |
| 2007/0202402 A1 | 8/2007 | Asahina et al. |
| 2007/0207080 A1 | 9/2007 | Yang |
| 2007/0207385 A1 | 9/2007 | Liu et al. |
| 2007/0209584 A1 | 9/2007 | Kalynushkin et al. |
| 2007/0212538 A1 | 9/2007 | Niu |
| 2007/0218366 A1 | 9/2007 | Kalynushkin et al. |
| 2007/0224508 A1 | 9/2007 | Aramata et al. |
| 2007/0224513 A1 | 9/2007 | Kalynushkin et al. |
| 2007/0238021 A1 | 10/2007 | Liu et al. |
| 2007/0243469 A1 | 10/2007 | Kim et al. |
| 2007/0264564 A1 | 11/2007 | Johnson et al. |
| 2007/0264574 A1 | 11/2007 | Kim et al. |
| 2007/0269718 A1 | 11/2007 | Krause et al. |
| 2007/0277370 A1 | 12/2007 | Kalynushkin et al. |
| 2008/0003496 A1 | 1/2008 | Neudecker et al. |
| 2008/0003503 A1 | 1/2008 | Kawakami et al. |
| 2008/0020281 A1 | 1/2008 | Kogetsu et al. |
| 2008/0038638 A1 | 2/2008 | Zhang et al. |
| 2008/0090149 A1 | 4/2008 | Sano et al. |
| 2008/0096110 A1 | 4/2008 | Bito et al. |
| 2008/0107967 A1 | 5/2008 | Liu et al. |
| 2008/0113271 A1 | 5/2008 | Ueda et al. |
| 2008/0118834 A1 | 5/2008 | Yew et al. |
| 2008/0124631 A1 | 5/2008 | Fukui et al. |
| 2008/0131782 A1 | 6/2008 | Hagiwara et al. |
| 2008/0138710 A1 | 6/2008 | Liaw et al. |

(56) References Cited

U.S. PATENT DOCUMENTS

| | | |
|---|---|---|
| 2008/0138716 A1 | 6/2008 | Iwama et al. |
| 2008/0145752 A1 | 6/2008 | Hirose et al. |
| 2008/0145759 A1 | 6/2008 | Sung et al. |
| 2008/0160415 A1 | 7/2008 | Wakita et al. |
| 2008/0176139 A1 | 7/2008 | White et al. |
| 2008/0206631 A1 | 8/2008 | Christensen et al. |
| 2008/0206641 A1 | 8/2008 | Christensen et al. |
| 2008/0233479 A1 | 9/2008 | Sung et al. |
| 2008/0233480 A1 | 9/2008 | Sung et al. |
| 2008/0241647 A1 | 10/2008 | Fukui et al. |
| 2008/0241703 A1 | 10/2008 | Yamamoto et al. |
| 2008/0248250 A1 | 10/2008 | Flemming et al. |
| 2008/0261112 A1 | 10/2008 | Nagata et al. |
| 2008/0305391 A1 | 12/2008 | Hirose et al. |
| 2009/0029256 A1* | 1/2009 | Mah .............. H01B 1/24 429/231.8 |
| 2009/0053589 A1 | 2/2009 | Obrovac et al. |
| 2009/0078982 A1 | 3/2009 | Rachmady et al. |
| 2009/0087731 A1 | 4/2009 | Fukui et al. |
| 2009/0101865 A1 | 4/2009 | Matsubara et al. |
| 2009/0117466 A1 | 5/2009 | Zhamu |
| 2009/0186267 A1 | 7/2009 | Tiegs |
| 2009/0239151 A1 | 9/2009 | Nakanishi et al. |
| 2009/0253033 A1 | 10/2009 | Hirose et al. |
| 2009/0269677 A1 | 10/2009 | Hirose et al. |
| 2009/0305129 A1 | 12/2009 | Fukui et al. |
| 2010/0085685 A1 | 4/2010 | Pinwill |
| 2010/0092868 A1 | 4/2010 | Kim et al. |
| 2010/0124707 A1 | 5/2010 | Hirose et al. |
| 2010/0136437 A1 | 6/2010 | Nishida et al. |
| 2010/0178565 A1* | 7/2010 | Green .............. H01M 4/0492 429/231.95 |
| 2010/0196760 A1 | 8/2010 | Green |
| 2010/0285358 A1 | 11/2010 | Cui et al. |
| 2010/0297502 A1 | 11/2010 | Zhu et al. |
| 2010/0330419 A1 | 12/2010 | Cui et al. |
| 2011/0104480 A1 | 5/2011 | Malekos et al. |
| 2011/0250498 A1 | 10/2011 | Green et al. |
| 2011/0309306 A1* | 12/2011 | Zhou .............. B82Y 40/00 252/500 |

FOREIGN PATENT DOCUMENTS

| | | |
|---|---|---|
| CN | 1821446 A | 8/2006 |
| CN | 101266919 A | 9/2008 |
| CN | 101371381 A | 2/2009 |
| CN | 101442124 A | 5/2009 |
| CN | 101449410 A | 6/2009 |
| CN | 101471457 A | 7/2009 |
| CN | 101510602 A | 8/2009 |
| CN | 101567462 A | 10/2009 |
| DE | 199 22 257 A1 | 11/2000 |
| DE | 103 47 570 A1 | 5/2005 |
| EP | 0 281 115 | 9/1988 |
| EP | 0 553 465 A1 | 8/1993 |
| EP | 0 820 110 A2 | 1/1998 |
| EP | 1 011 160 A1 | 6/2000 |
| EP | 0 936 687 B1 | 12/2001 |
| EP | 1 205 989 A2 | 5/2002 |
| EP | 1 231 653 A1 | 8/2002 |
| EP | 1 231 654 A1 | 8/2002 |
| EP | 1 258 937 A1 | 11/2002 |
| EP | 1 083 614 B1 | 5/2003 |
| EP | 1 313 158 A2 | 5/2003 |
| EP | 1 335 438 A1 | 8/2003 |
| EP | 1 289 045 B1 | 3/2006 |
| EP | 1 657 769 A1 | 5/2006 |
| EP | 1 850 409 A1 | 10/2007 |
| EP | 1 771 899 B1 | 2/2008 |
| EP | 1 657 768 B1 | 5/2008 |
| EP | 1 942 520 A2 | 7/2008 |
| EP | 2 058 882 | 5/2009 |
| EP | 2 204 868 A3 | 7/2010 |
| FR | 2 885 913 B1 | 8/2007 |
| GB | 0 980 513 | 1/1965 |
| GB | 1 014 706 | 12/1965 |
| GB | 2 395 059 A | 5/2004 |
| GB | WO 2009010758 A2 * | 1/2009 .......... H01M 4/0492 |
| GB | 2 464 157 B | 1/2010 |
| GB | 2 464 158 | 4/2010 |
| JP | 02-209492 A | 8/1990 |
| JP | 06-283156 | 10/1994 |
| JP | 10-046366 | 2/1998 |
| JP | 10-083817 | 3/1998 |
| JP | 10-199524 | 7/1998 |
| JP | 2000-003727 | 1/2000 |
| JP | 2000-173594 | 6/2000 |
| JP | 2000-348730 A | 12/2000 |
| JP | 2001-291514 | 10/2001 |
| JP | 2002-216751 A | 8/2002 |
| JP | 2002-279974 A | 9/2002 |
| JP | 2002260637 A | 9/2002 |
| JP | 2002-313319 A | 10/2002 |
| JP | 2002313345 A | 10/2002 |
| JP | 2003-017040 | 1/2003 |
| JP | 2003-168426 | 6/2003 |
| JP | 2003522367 A | 7/2003 |
| JP | 04-607488 | 2/2004 |
| JP | 2004-071305 | 3/2004 |
| JP | 2004-095264 | 3/2004 |
| JP | 2004-214054 | 7/2004 |
| JP | 2004-281317 | 10/2004 |
| JP | 2004-296386 A | 10/2004 |
| JP | 2004-533699 A | 11/2004 |
| JP | 2005-310759 | 11/2005 |
| JP | 2006-505901 A | 2/2006 |
| JP | 2006-276214 A | 10/2006 |
| JP | 2006-290938 A | 10/2006 |
| JP | 2006-335410 | 12/2006 |
| JP | 2007080827 A | 3/2007 |
| JP | 2007-165079 | 6/2007 |
| JP | 2007318057 A | 12/2007 |
| JP | 2008-034266 | 2/2008 |
| JP | 2008-186732 | 8/2008 |
| JP | 2008210618 A | 9/2008 |
| JP | 2008-234988 | 10/2008 |
| JP | 2008-235258 A | 10/2008 |
| JP | 2008-269827 A | 11/2008 |
| JP | 2008277000 A | 11/2008 |
| JP | 2009523923 A | 6/2009 |
| JP | 2009-164104 A | 7/2009 |
| JP | 2009-252348 A | 10/2009 |
| JP | 2010192444 A | 9/2010 |
| JP | 5000787 B2 | 8/2012 |
| JP | 2013510405 A | 3/2013 |
| KR | 20050090218 A | 9/2005 |
| KR | 2007-023141 | 2/2007 |
| KR | 2007-0110569 A | 11/2007 |
| KR | 2008-038806 A | 5/2008 |
| KR | 100839376 B1 | 6/2008 |
| KR | 20100066441 A | 6/2010 |
| NL | 1015956 | 8/2000 |
| SU | 471402 | 5/1975 |
| SU | 544019 | 1/1977 |
| WO | WO 99/33129 | 7/1999 |
| WO | WO 01/13414 A1 | 2/2001 |
| WO | WO 01/35473 A1 | 5/2001 |
| WO | WO 01/96847 A1 | 12/2001 |
| WO | WO 02/25356 A2 | 3/2002 |
| WO | WO 02/47185 A2 | 6/2002 |
| WO | WO 03/063271 A1 | 7/2003 |
| WO | WO 03/075372 A2 | 9/2003 |
| WO | WO 2004/042851 A2 | 5/2004 |
| WO | WO 2004/052489 A2 | 6/2004 |
| WO | WO 2004/083490 A2 | 9/2004 |
| WO | WO 2004/109839 A1 | 12/2004 |
| WO | WO 2005/011030 A1 | 2/2005 |
| WO | WO 2005/113467 A1 | 12/2005 |
| WO | WO 2005/119753 A2 | 12/2005 |
| WO | WO 2006/067891 A1 | 6/2006 |
| WO | WO 2006/073427 A2 | 7/2006 |
| WO | WO 2006/120332 A2 | 11/2006 |
| WO | WO 2007/044315 A1 | 4/2007 |

(56) References Cited

FOREIGN PATENT DOCUMENTS

| WO | WO 2007/083152 A1 | 7/2007 |
|---|---|---|
| WO | WO 2007/083155 | 7/2007 |
| WO | WO 2007/114168 A1 | 10/2007 |
| WO | WO 2007/136164 A1 | 11/2007 |
| WO | WO 2008/029888 A1 | 3/2008 |
| WO | WO 2008/044683 A1 | 4/2008 |
| WO | WO 2008/072460 A1 | 6/2008 |
| WO | WO 2008/097723 A1 | 8/2008 |
| WO | WO 2008/139157 A1 | 11/2008 |
| WO | WO 2009/010757 | 1/2009 |
| WO | WO 2009/010758 | 1/2009 |
| WO | WO 2009/010759 | 1/2009 |
| WO | WO 2009/026466 | 2/2009 |
| WO | WO 2009/120404 A1 | 10/2009 |
| WO | WO 2009/128800 | 10/2009 |
| WO | WO 2010/040985 | 4/2010 |
| WO | WO 2010/040986 | 4/2010 |
| WO | WO 2010/060348 A1 | 6/2010 |
| WO | WO 2010/128310 A1 | 11/2010 |
| WO | WO 2010/130975 A1 | 11/2010 |
| WO | WO 2010/130976 A1 | 11/2010 |

OTHER PUBLICATIONS

Badel et al., "Formation of Ordered Pore Arrays at the Nanoscale by Electrochemical Etching of N-Type Silicon", Superlattices and Microstructures, 36 (2004) 245-253.
Barraclough et al., "Cold Compaction of Silicon Powders Without a Binding Agent", Materials Letters 61 (2007) 485-487.
Beaulieu et al., "Colossal Reversible Volume Changes in Lithium Alloys", Electrochemical and Solid-State Letters, 4 (9) (2001) A137-A140.
Beaulieu et al., "Reaction of Li with Grain-Boundary Atoms in Nanostructured Compounds", Journal of The Electrochemical Society, 147 (9) (2000) 3206-3212.
Besenhard et al., "Will Advanced Lithium-Alloy Anodes Have a Chance in Lithium-Ion Batteries?", Journal of Power Sources, 68 (1997) 87-90.
Boukamp et al., "All-Solid Lithium Electrodes with Mixed-Conductor Matrix", J. Electrochem. Soc.: Electrochemical Science and Technology, vol. 128, No. 4, (1981) 725-729.
Bourderau, et al., "Amorphous Silicon as a Possible Anode Material for Li-Ion Batteries", Journal of Power Sources, 81-82 (1999) 233-236.
Canham, L. T., "Diffusion of Li in Si", Properties of Silicon, EMIS Datareviews Series No. 4 (1987) 454-462.
Chan et al., "Surface Chemistry and Morphology of the Solid Electrolyte Interphase on Silicon Nanowire Lithium-Ion Battery Anodes", Journal of Power Sources, 189(2), 1132-1140, (2009).
Chang et al., "Ultrafast Growth of Single-Crystalline Si Nanowires", Materials Letters, 60 (2006) 2125-2128.
Chen et al., Binder Effect on Cycling Performance of Silicon/Carbon Composite Anodes for Lithium Ion Batteries, 36 (2006) 1099-1104.
Chen et al., "Effect of Vinylene Carbonate (VC) as Electrolyte Additive on Electrochemical Performance of Si Film Anode for Lithium Ion Batteries", Journal of Power Sources, 174(2), 538-543, (2007).
Chen et al., "Selective Etching of Silicon in Aqueous Ammonia Solution", Sensors and Actuators, A 49 (1995) 115-121.
Chevrier et al., "Methods for Successful Cycling of Alloy Negative Electrodes in Li-Ion Cells", 220th ECS Meeting, Abstract #1237 (2011).
Choi et al., "Effect of Fluoroethylene Carbonate Additive on Interfacial Properties of Silicon Thin-Film Electrode", Journal of Power Sources, 161(2), 1254-1259 (2006).
Colinge, Jean-Pierre, "Silicon-on-Insulator Technology: Materials to VLSI", Chapter 2, SOI Materials, (1991), Cover page and p. 38.

Deal et al., "General Relationship for the Thermal Oxidation of Silicon", Journal of Applied Physics, vol. 36, No. 12, (Dec. 1965) 3770-3778.
De Angelis et al., "Water Soluble Nanoporous Nanoparticles for In Vivo Targeted Drug Deliver and Controlled Release in B Cells Tumor Context", Nanoscale, 1020, vol. 2, p. 2230-2236.
El Ouatani et al., "The Effect of Vinylene Carbonate Additive on Surface Film Formation on Both Electrodes in Li-Ion Batteries", J. Electrochem. Soc., 156(2), A103-A113 (2009).
Feng et al., "Lithography-Free Silicon Micro-Pillars as Catalyst Supports for Microfabricated Fuel Cell Applications", Electrochemistry Communications, 8 (2006) 1235-1238.
Garrido, et al., The Role of Chemical Species in the Passivation of <100> Silicon Surfaces by HF in Water-Ethanol Solutions, J. Electrochem Soc., vol. 143, No. 12, 1996, p. 4059-4066.
Green et al., "Mesoscopic Hemisphere Arrays for use as Resist in Solid State Structure Fabrication", J. Vac. Sci. Technol. B 17(5) (1999) 2074-2083.
Green et al., "Quantum Pillar Structures on n+ Gallium Arsenide Fabricated Using "Natural" Lithography", Appl. Phys. Lett., 62 (3) (1993) 264-266.
Green et al., "Structured Silicon Anodes for Lithium Battery Applications", Electrochemical and Solid-State Letters, 6 (5) (2003) A75-A79.
Han et al., "Neutralized Poly (Acrylic Acid) as Polymer Binder for High Capacity Silicon Negative Electrodes", 220th ECS Meeting, Abstract #1250 (2011).
Heinze et al., "Viscosity Behaviour of Multivalent Metal Ion-Containing Carboxymethyl Cellulose Solutions", Die Angewandte Makromolekulare Chamie 220, 123-132, (Nr. 3848), (1994).
Hochgatterer et al., "Silicon/Graphite Composite Electrodes for High Capacity Anodes: Influence of Binder Chemistry on Cycling Stability", Electrochemical and Solid-State Letters, 11 (5) (2008) A76-A80.
Huggins, Robert A., "Lithium Alloy Anodes" in Handbook of Battery Materials, J.O. Besenhard Ed., Wiley-VCH, Weinheim, 361-381 (1999).
Ivanovskaya et al., "The Effect of Treatment of Cation-Selective Glass Electrodes With AgNO3 Solution on Electrode Properties", Sensors and Actuators B 24-25 (1995) 304-308.
Jianfeng et al., "Large-Scale Array of Highly Oriented Silicon-Rich Micro/Nanowires Induced by Gas Flow Steering", Solid State Communications, 133 (2005) 271-275.
Kasavajjula et al., "Nano- and Bulk-Silicon-Based Insertion Anodes for Lithium-Ion Secondary Cells", Journal of Power Sources, 163 (2007) 1003-1039.
Key to Metal Aluminum-Silicon Alloys, www.keytometals.com/Article80.
Kim et al., "(110) Silicon Etching for High Aspect Ratio Comb Structures", 1997 6th International Conference on Emerging Technologies and Factory Automation Proceedings, (1997) 248-252.
Kim et al., "Improvement of Silicon Powder Negative Electrodes by Copper Electroless Deposition for Lithium Secondary Batteries", Journal of Power Sources, 147 (2005) 227-233.
Kleimann et al., "Formation of Wide and Deep Pores in Silicon by Electrochemical Etching", Materials Science and Engineering, B69-70 (2000) 29-33.
Kolasinski, Kurt W., "Silicon Nanostructures from Electroless Electrochemical Etching", Current Opinion in Solid State and Materials Science, 9 (2005) 73-83.
Komba et al., "Functional Interface of Polymer Modified Graphite Anode", Journal of Power Sources, 189, (2009), 197-203.
Komba et al., "Polyacrylate as Functional Binder for Silicon and Grapite Composite Electrode in Lithium-Ion Batteries", Electrochemistry, 79(1), (2010), 6-9.
Komba et al., "Polyacrylate Modifier for Graphite Anode of Lithium-Ion Batteries", Electrochemical and Solid-State Letters, 12(5), (2009), A107-A110.
Komba et al., "Study on Polymer Binders for High-Capacity SiO Negative Electrode of Li Ion Batteries", Journal of Physical Chemistry, 115, (2011), 13487-13495.
Lang, Walter, "Silicon Microstructuring Technology", Materials Science and Engineering, R17 (1996) 1-55.

(56) References Cited

OTHER PUBLICATIONS

Lee et al., "Effect of Poly (Acrylic Acid) on Adhesion Strength and Electrochemical Performance of Natural Graphite Negative Electrode for Lithium-Ion Batteries", Journal of Power Sources, 161(1), (2006), 612-616.
Li et al., "A High Capacity Nano-Si Composite Anode Material for Lithium Rechargeable Batteries", Electrochemical and Solid-State Letters, 2 (11) (1999) 547-549.
Li et al., "Sodium Carboxymethyl Cellulose: A Potential Binder for Si Negative Electrodes for Li-Ion Batteries", Electrochemical and Solid-State Letters, 10(2) (2007), A17-A20.
Li et al., "The Crystal Structural Evolution of Nano-Si Anode Caused by Lithium Insertion and Extraction at Room Temperature", Solid State Ionics, 135 (2000) 181-191.
Liu et al., "A Novel Method of Fabricating Porous Silicon Material: Ultrasonically Enhanced Anodic Electrochemical Etching", Solid State Communications, 127 (2003) 583-588.
Liu et al., "Effect of Electrode Structure on Performance of Si Anode in Li-Ion Batteries: Si Particle Size and Conductive Additive", Journal of Power Source, 140 (2005) 139-144.
Liu et al., "Enhanced Cycle Life of Si Anode for Li-Ion Batteries by Using Modified Elastomeric Binder", Electrochemical and Solid-State Letters, 8(2) (2005), A100-A103.
Lu et al., "A Study of the Mechanisms of Erosion in Silicon Single Crystals Using Hertzian Fracture Tests", Wear, 186-187 (1995) 105-116.
Maranchi et al., "Interfacial Properties of the a-Si/Cu: Active-Inactive Thin-Film Anode Systems for Lithium-Ion Batteries", Journal of the Electrochemical Society: 153 (6) (2006) A1246-A1253.
Nakahata et al., "Fabrication of Lotus-Type Porous Silicon by Unidirectional Solidification in Hyrdogen", Materials Science and Engineering A 384 (2004) 373-376.
Niparko, J.K. (Editor), "Cochlear Implant Technology", Pub., Lippincott Williams and Wilkins, Philadelphia, (2000) 108-121.
Obrovac et al., "Structural Changes in Silicon Anodes During Lithium Insertion/Extraction", Electrochemical and Solid-State Letters, 7(5), (2004), A96-A96.
Ohara et al., "A Thin Film Silicon Anode for Li-Ion Batteries Having a Very Large Specific Capacity and Long Cycle Life", Journal of Power Sources, 136 (2004) 303-306.
Pei et al., "Silicon Nanowires Grown from Silicon Monoxide Under Hydrothermal Conditions", Journal of Crystal Growth, 289 (2006) 423-427.
Peng et al., "Dendrite-Assisted Growth of Silicon Nanowires in Electroless Metal Deposition", Adv. Funct. Mater., 13, No. 2 (2003) 127-132.
Peng et al., "Fabrication of Large-Area Silicon Nanowire p-n Junction Diode Arrays", Adv. Mater. (2004), vol. 16, No. 1, 73-76.
Peng et al., "Silicon Nanowires for Rechargeable Lithium-ion Battery Anodes", Applied Physics Letters (2008) vol. 93, No. 3, pp. 33105-1 to 33105-3.
Peng et al., "Simultaneous Gold Deposition and Formation of Silicon Nanowire Arrays", Journal of Electroanalytical Chemistry, 558 (2003) 35-39.
Peng et al., "Synthesis of Large-Area Silicon Nanowire Arrays via Self-Assembling Nanoelectrochemistry", Adv. Mater., 14, No. 16 (2002) 1164-1167.
Peng et al., "Uniform, Axial-Orientation Alignment of One-Dimensional Single-Crystal Silicon Nanostructure Arrays", Angew. Chem. Ind. Ed., 44 (2005) 2737-2742.
Peng, et al., "Fabrication of Single-Crystalline Silicon Nanowires by Scratching a Silicon Surface with Catalytic Metal Particles", Adv. Funct. Mater., 16 (2006), 387-394.
Qiu et al., "From Si Nanotubes to Nanowires: Synthesis, Characterization, and Self-Assembly", Journal of Crystal Growth, 277 (2005) 143-148.
Qiu et al., "Self-Assembled Growth and Optical Emission of Silver-Capped Silicon Nanowires", Applied Physics Letters, vol. 84, No. 19, (2004) 3867-3869.
Russo, et al., "A Mechanical Approach to Porous Silicon Nanoparticles Fabrication", Materials 2011, vol. 4, p. 1023-1033.
Sharma et al., "Thermodynamic Properties of the Lithium-Silicon System", J. Electrochem. Soc.: Electrochemical Science and Technology, vol. 123 (1976) 1763-1768.
Shin et al., "Porous Silicon Negative Electrodes for Rechargeable Lithium Batteries", Journal of Power Sources, 139 (2005) 314-320.
Sugama, et al., "Nature of Interfacial Interaction Mechanisms Between Polyacrylic Acid Macromolecules and Oxide Metal Surfaces", Journal of Materials Science, 19 (1984) 4045-4056.
Takami et al., "Silicon Fiber Formed on Silicon Without Using a Gas Process", Journal of Applied Physics, vol. 91, No. 12, 2-5 (2002).
Tokoro et al., "Anisotropic Etching Properties of Silicon in KOH and TMAH Solutions", Proceedings of the 1998 International Symposium on Micromechatronics and Human Science (1998) 65-70.
Tsuchiya et al., "Structural Fabrication Using Cesium Chloride Island Arrays as a Resist in a Fluorocarbon Reactive Ion Etching Plasma", Electrochemical and Solid-State Letters, 3 (1) (2000) 44-46.
Ui et al., "Improvement of Electrochemical Characteristics of Natural Graphite Negative Electrode Coated With Polyacrylic Acid in Pure Propylene Carbonate Electrolyte", Journal of Power Sources, 173(1), (2007), 518-521.
Wagner et al., "Vapor-Liquid-Solid Mechanism of Single Crystal Growth", Applied Physics Letters, vol. 4, No. 5 (1964) 89-90.
Wen et al., "Chemical Diffusion in Intermediate Phases in the Lithium-Silicon System", Journal of Solid State Chemistry, 37 (1981) 271-278.
Weydanz et al., "A Room Temperature Study of the Binary Lithium-Silicon and the Ternary Lithium-Chromium-Silicon System for use in Rechargeable Lithium Batteries", Journal of Power Sources, 81-82 (1999) 237-242.
Winter, et al., "Insertion Electrode Materials for Rechargeable Lithium Batteries", Advanced Materials, 1998, 10, No. 10.
Wong et al., "Controlled Growth of Silicon Nanowires Synthesized Via Solid-Liquid-Solid Mechanism", Science and Technology of Advanced Materials, 6 (2005) 330-334.
Yabuuchi et al., "Graphite-Silicon-Polyacrylate Negative Electrodes in Ionic Liquid Electrolyte for Safer Rechargeable Li-Ion Batteries", Advanced Energy Materials, 1, (2011), 759-765.
Yan et al., "Growth of Amorphous Silicon Nanowires via a Solid-Liquid-Solid Mechanism", Chemical Physics Letters, 323 (2000) 224-228.
Yan et al., "$H_2$-Assisted Control Growth of Si Nanowires", Journal of Crystal Growth, 257 (2003) 69-74.
Ye et al., Controllable Growth of Silver Nanostructures by a Simple Replacement Reaction and Their SERS Studies, Solid State Sciences 11 (2009), p. 1088-1093.
Yoshio et al., "Electrochemical Behaviors of Silicon Based Anode Material", Journal of Power Sources, 153 (2006) 375-379.
Zhang et al., "A Review on Electrolyte Additives for Lithium-Ion Batteries", Journal of Power Sources, 162(2), 1379-1394, (2006).
Zhang et al., "Bulk-Quantity Si Nanowires Synthesized by SiO Sublimation", Journal of Crystal Growth, 212 (2000) 115-118.
Zhang et al., "Catalytic Growth of x-FiSi$_2$ and Silicon Nanowires", Journal of Crystal Growth, 280 (2005) 286-291.
Zhang et al., "Synthesis of Thin Si Whiskers (Nanowires) Using SiCl$_4$", Journal of Crystal Growth, 2006 (2001) 185-191.
International Search Report dated Nov. 29, 2011 for App. PCT/GB2011/001298.
Written Opinion dated Nov. 29, 2011 for App. PCT/GB2011/001298.
"Peng Yun, et al. "Comparative Analysis of Two Different Treatment Technology in PCB Spent Etching-Cyclic Regeneration Technique and Copper Sulfate Processing Technique", Printed Circuit Information, No. 7, pp. 51-53, dated Jul. 10, 2007."
Uzun, Orhan et al., "Production and Structure of Rapidly Solidified Al—Si Alloys", Turk J Phys, 25, pp. 455-466 (2001).

* cited by examiner

POROUS ELECTROACTIVE MATERIAL

The present invention relates to an electroactive material comprising silicon; the use of such a material in the preparation of an electrode; an electrode including the electroactive silicon material of the invention; the use of an electrode in the preparation of an electrochemical cell and to an electrochemical cell or battery including such an electrode.

1. BACKGROUND

Lithium ion rechargeable batteries are well known. The basic construction of a lithium ion rechargeable battery is shown in FIG. 1. The battery cell includes a single cell, but may include multiple cells.

The battery cell generally comprises a copper current collector 10 for the anode and an aluminium current collector 12 for the cathode, which are externally connectable to a load or to a recharging source as appropriate. It should be noted that the terms "anode" and "cathode" are used in the present specification as those terms are understood in the context of batteries placed across a load, i.e. the term "anode" denotes the negative pole and the term "cathode" the positive pole of the battery. A graphite-based composite anode layer 14 overlays the current collector 10 and a lithium containing metal oxide-based composite cathode layer 16 overlays the current collector 12. A porous plastic spacer or separator 20 is provided between the graphite-based composite anode layer 14 and a lithium containing metal oxide-based composite cathode layer 16: a liquid electrolyte material is dispersed within the porous plastic spacer or separator 20, the composite anode layer 14 and the composite cathode layer 16. In some cases, the porous plastic spacer or separator 20 may be replaced by a polymer electrolyte material and in such cases the polymer electrolyte material is present within both the composite anode layer 14 and the composite cathode layer 16.

When the battery cell is fully charged, lithium has been transported from the lithium containing metal oxide in the cathode via the electrolyte into the graphite-based anode where it is intercalated by reacting with the graphite to create a lithium carbon compound, typically $LiC_6$. The graphite, being the electrochemically active material in the composite anode layer, has a theoretical maximum capacity of 372 mAh/g.

The use of silicon as an active anode material in secondary batteries such as lithium ion batteries is well known (see, for example, Insertion Electrode Materials for Rechargeable Lithium Batteries, M. Winter, J. O. Besenhard, M. E. Spahr, and P. Novak in Adv. Mater. 1998, 10, No. 10 and also Wang, Kasavajjula et al, J. Power Source's 163 (2007) 1003-1039). It is generally believed that silicon, when used as an active anode material in a lithium-ion rechargeable cell, can provide a significantly higher capacity than the currently used graphite anode materials. Silicon, when converted to the compound $Li_{21}Si_5$ by reaction with lithium in an electrochemical cell, has a theoretical maximum capacity of 4,200 mAh/g, considerably higher than the maximum capacity for graphite.

Early approaches of using silicon or silicon based active anode materials in a lithium ion electrochemical cell included the use of bulk silicon anodes, silicon powder anodes comprising nanometer and micron sized silicon powders, thin film silicon anodes and silicon anodes comprising silicon structures other than or in addition to powders. Composite anodes comprising a dispersion of silicon in an inactive or active matrix material have also been investigated. However, many of the approaches have failed to show sustained or adequate capacity over the required number of charge/discharge cycles.

Electrodes comprising bulk silicon failed to exhibit good capacity retention and cycle-ability over a number of charging and discharging cycles. This poor performance was attributed to the mechanical stresses that arise within the electrode structure during the charging cycle. Intercalation or insertion of lithium ions into the bulk silicon structure during the charging cycle causes a massive expansion of the silicon containing material, which leads to a build-up of mechanical stress within the electrode structure and eventually causes cracking, delamination and loss of contact within and between the components of the electrode structure and the current collector respectively.

It should be understood that the term "intercalation" when used in relation to electroactive materials, particularly the silicon-containing materials, referred to herein includes a process where lithium is inserted into and disrupts the structure of the crystalline or amorphous silicon-containing material as well as a process in which lithium is dispersed between crystal planes defining the silicon-containing structure. The former process is more properly referred to as lithium insertion and is observed for materials comprising pure or substantially pure crystalline, amorphous and/or polycrystalline silicon. Some compounds or alloys of silicon will, however, also exhibit this form of behaviour. The dispersion of lithium between crystal planes within a crystalline or polycrystalline silicon-containing material is more often referred to as "intercalation" and is usually observed for materials comprising compounds or alloys of silicon.

In an attempt to overcome the stresses associated with bulk silicon anodes, anodes including silicon structures that are more easily able to accommodate the volume changes that occur on charging have been fabricated.

One of the earlier approaches employed anodes comprising pure silicon powder. Although it was expected that anodes fabricated from silicon powder would be better able to accommodate the volume expansion associated with lithium intercalation or insertion compared to bulk silicon electrodes, it was found that, in practice, these electrodes fared little better than bulk silicon electrodes and breakdown of the electronically conductive network due to the expansion of silicon powder particles was also observed.

In an attempt to improve the electronic contact between anode components during the charging and discharging of the cell, composite anodes comprising a mixture of powdered silicon and additional components such as a conductive material, a binder and optionally a further electroactive material were prepared. It was anticipated that these further components would be able to suppress and/or accommodate the large volume changes associated with the silicon species during the charging and discharging cycles of the cell. However, these electrodes were found to exhibit a reduced capacity compared with electrodes comprising silicon only and were unable to maintain this capacity over a required number of charging and discharging cycles.

In one prior art approach described by Ohara et al. (Journal of Power Sources 136 (2004) 303-306) which addresses the problems associated with the expansion and contraction of silicon during the charging and discharging cycles of the battery, silicon is evaporated onto a nickel foil current collector as a thin film and this structure is then used to form the anode of a lithium ion cell. However, although this approach gives good capacity retention, this is the case for only very thin films and thus the structures do not give usable amounts of capacity per unit area and increasing the film thickness to give usable amounts of capacity per unit area causes the good capacity retention to be eliminated due to mechanical breakdown as a result of the large volume expansion within the film.

Another approach used to address the problems associated with expansion of the silicon film is described in U.S. Pat. No. 6,887,511: Silicon is evaporated onto a roughened copper substrate to create medium thickness films of up to 10 µm. During the initial lithium ion insertion process the silicon film breaks up to form columns of silicon. These columns can then reversibly react with lithium ions and good capacity retention is achieved. However, the process does not function well with thicker films and the creation of the medium thickness film is an expensive process. Furthermore the columnar structure caused by the break-up of the film has no inherent porosity, which means that over time the pillars will, themselves, begin to crack and the electrode structure will likely not exhibit long term capacity retention.

In an attempt to overcome the problems associated with the bulk silicon, silicon powder and thin film silicon anodes described above, many workers have investigated alternative silicon and anode structures for the fabrication of anodes for lithium ion batteries. Examples of silicon structures investigated include arrays of silicon pillars formed on wafers and particles; silicon fibres, rods, tubes or wires; and complete porous particles comprising silicon. Anode structures having pores or channels formed therein have also been investigated.

U.S. Pat. No. 6,334,939 and U.S. Pat. No. 6,514,395 each disclose silicon based nano-structures for use as anode materials in lithium ion secondary batteries. Such nano-structures include cage-like spherical particles and rods or wires having diameters in the range 1 to 50 nm and lengths in range 500 nm to 10 µm. Similar nanostructures are disclosed in KR 1020027017125 and ZL 01814166.8. JP 04035760 discloses silicon based anode materials comprising carbon-coated silicon fibres having diameters in the range 10 nm to 50 µm for use in lithium ion secondary batteries. Batteries prepared using these nano-structures exhibited a total first cycle charging capacity of 1300 mAh/g and a reversible capacity of 800 mAh/g.

US 2007/0281216 discloses an anode active material for a lithium secondary battery comprising a mixture of silicon nano-particles, graphite, carbon black and a binder. The silicon nano-particles comprise either thread-like aggregates (a chain of connected spheroidal particles) having a primary particle size in the range 20 to 200 nm and a specific surface area of 11 m$^2$/g or spherical particles having a primary particle size in the range 5 to 50 nm and a specific surface area of 170 m$^2$/g. The silicon particles and threads are prepared using techniques such as chemical vapour deposition. Anodes exhibiting a capacity of up to 1000 mAh/g over 50 cycles are illustrated. The life of the battery is significantly increased if the battery is operated at a limited voltage level.

Polycrystalline silicon nano-wires and wires having cross-sectional diameters in the range 20 to 500 nm and aspect ratios of greater than 10, 50 or 100 and which have been prepared using epitaxial and non-epitaxial growth techniques are disclosed in U.S. Pat. No. 7,273,732.

Single crystalline silicon fibres, pillars or rods having diameters in the range 0.1 to 1 µm and lengths in the range 1 to 10 µm can also be prepared using lithographic and etching techniques as disclosed in U.S. Pat. No. 7,402,829. Alternative etching techniques such as those disclosed in WO 2007/083155, WO 2009/010758 and WO 2010/040985 can also be used.

The fibres, wires and rods described above are typically formed into a composite material containing, in addition to the silicon rods, wires and fibres, additional ingredients such as a binder, a conductive material and optionally a further electroactive material other than silicon. The composite material is also known as an anode mix and is typically used in the fabrication of anodes for lithium ion batteries. In accordance with the disclosure of the present inventors in WO 2009/010758 and WO 2009/010757 anode materials comprising silicon fibres or rods are preferably in the form of an entangled "felt" or "mat" in which silicon fibres are randomly connected with each other either directly or indirectly through the other components of the mix, and are also connected with the copper foil which acts as the current collector of the electrode.

By the term "felt or mat" it should be understood to mean a structure in which any one of the components of the structure is connected in a random or ordered manner with one or more other components of the structure so that there are multiple interconnections between the components. The mat may be provided in the form of a coating layer which is directly or indirectly applied, bonded or connected to a current collector or it may be in the form of a self-supporting structure, although this is less preferred. Preferably a felt or mat comprises one or more species of fibre as these help to strengthen the overall structure.

It has been observed by the present inventors that these felt structures produced using the silicon rod, wire and fibre products described above have an inherent porosity, (that is they contain voids or spaces between the fibres) as a result of the maximum attainable packing density of a random arrangement of fibres within a defined volume. These inherently porous electrodes were found to exhibit better capacity retention and cycling lifetimes compared to electrodes produced from bulk silicon, silicon powders and silicon films, for example. Without wishing to be constrained by theory, it is believed that the inherent porosity of these electrode structures provides at least some of the silicon components of the anode with space to expand into the voids or pores that are part of the electrode structure rather than push against each other during lithium intercalation or insertion (charging). The pores of the electrode are therefore able to accommodate the expansion of these silicon components during lithium intercalation or insertion within the volume initially occupied by the uncharged anode material, thereby reducing the volume increase within the electrode structure, the build up of stress and the application of pressure on the other cell components during the charging and discharging cycle As a result there will be less cracking of the silicon structures within the anode and a reduction in the extent of delamination of the electrode coating from the current collector, leading to better capacity retention and cycle-ability. The pores or voids also facilitate penetration of and therefore contact of the electrolyte with as much of the surface of the silicon material as possible during charging and discharging of the anode. This porosity is therefore believed to be important as it provides a path by which the lithium can be intercalated (or inserted) into the whole of the silicon material so that the lithiation of the silicon is as uniform as possible throughout the anode mass.

In addition to using silicon rods and fibres for the fabrication of porous electrode structures, it is also known to use silicon components which are themselves porous in the fabrication of porous electrodes or to form holes or channels into silicon based electrode structures having minimal porosity.

US 2009/0253033 discloses anode active materials having an inherent porosity for use in lithium ion secondary batteries. The anode material comprises silicon or silicon alloy particles with dimensions of between 500 nm and 20 µm and a binder or binder precursor. These particles are manufactured using techniques such as vapour deposition, liquid phase deposition or spraying techniques. During anode fabrication, the silicon/binder composite is heat treated to carbonise or partially carbonise the binder component thereby providing the anode with an inherent porosity. In a preferred embodiment the anodes of US 2009/0253033 include pores having dimensions in the range 30 nm to 5000 nm in order to accommodate the expansion of the silicon material during the charging and discharging phases of the battery. Anodes prepared using such silicon materials exhibit a capacity retention of from 70 to 89% and an expansion coefficient of 1 to 1.3.

Porous silicon anodes created by electrochemically etching channels into a silicon wafer have also been prepared. See, for example, H C Shin et al, J. Power Sources 139 (2005) 314-320. Electrolyte penetration was observed for channels having a pore diameter of 1 to 1.5 µm. It was observed that the peak current and the charge transferred during cyclic voltammetry increased with channel depth up to a limit. The amount of charge transferred for channels having an aspect ratio (channel depth to pore diameter) of the order of 1 was found to be only marginally less than those having an aspect ratio of 5. It was suggested that the channel walls were able to participate in the lithiation/dilithiation and that the presence of channels effectively increased the reactive area of the electrode. The porous structure remained essentially the same after a number of charge/discharge cycles despite the volume changes occurring as a result of the intercalation or insertion and release of lithium during these cycles. The channels created by electrochemical etching of a silicon wafer differ from the pores or voids created upon formation of a meshed electrode material using silicon fibres, wires and rods as described above in WO 2009/101758 and WO 2009/040985. The electrochemically etched electrode material is rigid and the entire volume of the electrode material will expand upon lithium intercalation or insertion. In contrast the voids within the meshed electrode material are able to contract and expand in response to the increase and decrease in the volume of the mesh comprising silicon components during lithium intercalation or insertion and release respectively. This means that silicon mesh type electrodes are more able to accommodate volume changes within the electrode structure upon lithium intercalation or insertion.

Rigid electrode structures such as those prepared by Shin et al tend to be associated with a build up of stress within the electrode structure on lithium intercalation or insertion as a result of the isotropic volume expansion of the entire electrode material. Providing the voids within the electrode structure are sufficiently open, the silicon mesh provides access for the electrolyte into the bulk of the electroactive anode. In contrast the more flexible meshed electrode structures including voids as described above are more able to accommodate expansion of the silicon material on lithium intercalation or insertion due the contraction and expansion of voids as described above. The overall expansion of a meshed electrode structure is therefore significantly less than that of the rigid channeled electrode structure described by Shin et al. This means that there will less build up of stress within meshed electrode structures compared to rigid electrode structures.

Porous silicon particles are also known and have been investigated for use in lithium ion batteries. The cost of manufacturing these particles is believed to be less than the cost of manufacturing alternative silicon structures such as silicon fibres, ribbons or pillared particles, for example. However, the life cycle performance of many of the composite electrodes prepared to date, which comprise porous silicon particles needs to be significantly improved before such electrodes could be considered to be commercially viable.

Porous silicon particles having dimensions in the range 4 to 11 µm, an average pore sizes of 6 to 8 Å and a BET surface area of from 41 to 143 $m^2/g$ have been prepared for use in fields such as drug delivery and explosive design (Subramanian et al, Nanoporous Silicon Based Energetic Materials, Vesta Sciences NJ 08852 Kapoor and Redner, US Army RDE-COM-ARDEC Picatinny Arsenal NJ 07806, Proceedings of the Army Science Conference ($26^{th}$) Orlando, Fla., 1-4 Dec. 2008). There is no indication in Subramanian et al that their silicon containing porous particles would be suitable for use in the fabrication of lithium ion batteries.

Silicon nanosponge particles having a network of pores extending through the particle structure have also been prepared, U.S. Pat. No. 7,569,202. Nanosponge particles having a diameter of 1 to 4 µm and pore diameters of 2 to 8 nm are prepared by stain etching metallurgical grade silicon powders to remove both silicon material and impurities. It is believed that the impurities in the metallurgical grade silicon are preferentially etched away to give particles having a network of pores distributed throughout. The nanosponge particles can be surface treated to introduce functional groups onto the silicon surface. U.S. Pat. No. 7,569,202 teaches that the surface functional groups enable the nanosponge particles to be used for a broad range of applications from drug delivery to explosives. U.S. Pat. No. 7,569,202 does not teach the application of nanosponge particles in lithium ion batteries.

U.S. Pat. No. 7,244,513 discloses a partially porous silicon powder comprising silicon particles having a solid silicon core and an outermost layer of porous silicon. These partially porous silicon particles are prepared by stain etching particles having a dimension in the range 1 µm to 1 mm to give partially porous particles having a porous outer shell in which the pore dimensions in the range 1 nm to 100 nm. The partially porous particles are then subjected to ultrasonic agitation to give silicon nanoparticles having a dimension in the range 10 nm to 50 nm. U.S. Pat. No. 7,244,513 teaches that the nanoparticles could be used in applications such as sensors, floating gate memory devices, display devices and biophysics. There is no suggestion that these nanoparticles could be used in the fabrication of a lithium ion battery.

US 2004/0214085 discloses an anode material comprising an aggregate of porous particles that is capable of withstanding pulverization during the charging and discharging cycles of the battery. According to US 2004/0214085, the reason why the particles are able to withstand pulverisation is because the external volume of the porous particle is maintained during the charging and discharging cycle of the battery due to compression of the particle voids when the particle expands during the process of intercalating lithium ions into silicon. The porous particles in the aggregate have an average particle size in the range 1 µm to 100 µm and pore sizes in the range 1 nm to 10 µm. For particles having diameters of less than 1 µm the relative volume of the pores within the particle is excessive and the hardness of the particle is compromised. Particles having a diameter of more than 100 µm are unable to accommodate the volume changes associated with the intercalation or insertion and deintercalation or release of lithium and cannot prevent pulverisation of the particle. The particles are prepared by quenching an alloy of silicon with another element, M to form a quenched alloy particle comprising an amorphous silicon phase and an element, M, which can be eluted from the particle to provide a porous particle. 50:50 and 80:20 silicon-nickel alloys and 70:30 Al:Si alloys were used to prepare alloy containing particles using a gas atomisation technique in which a helium gas pressure of 80 kg/cm$^2$ and a quenching rate of $1\times10^5$ K/s was used. The quenched particles were washed in acid ($H_2SO_4$ or HCl) to remove either the Ni or the Al to give porous particles, which contained a mixture of both amorphous and crystalline silicon. Batteries prepared using the Si porous materials of US 2004/0214085 have a capacity retention of between 83 and 95% over 30 cycles.

The porous particle of US 2004/0214085 is characterised by the ratio of the pore diameter, n, to the particle diameter, N and the volume ratio of the voids to the porous particle. n/N is preferably in the range 0.001 to 0.2 so that the diameter of the pores within the particles is very small in order that the hardness of the particle can be maintained. The volume ratio of the voids to the porous particle is preferably in the ratio 0.1% to 80% so that the expansion and contraction of the silicon volume during intercalation or insertion and deintercalation or release of lithium is fully compensated by the voids, the entire volume of the porous particle is maintained and the particles are not degenerated.

U.S. Pat. No. 7,581,086 discloses an electrode material comprising porous silicon particles, which particles are prepared by quenching a eutectic alloy of silicon and another metal (typically aluminium) using a roll solidification method at a cooling rate of greater than 100K/s to give a thin film alloy sheet. The thin film is pulverised to give alloy particles having a typical diameter of 15 µm, which are typically etched in HCl to give porous Si particles. Electrode materials prepared from these powder particles exhibited a capacity retention of approximately 68% at 10 cycles.

US 2009/0186267 discloses an anode material for a lithium ion battery, the anode material comprising porous silicon particles dispersed in a conductive matrix. The porous silicon particles have a diameter in the range 1 to 10 µm, pore diameters in the range 1 to 100 nm (preferably 5 nm), a BET surface area value in the range 140 to 250 m$^2$/g and crystallite sizes in the range 1 to 20 nm. The porous silicon particles are mixed with a conductive material such as carbon black and a binder such as PVDF to form an electrode material, which can be applied to a current collector (such as a copper foil) to give an electrode. Although US 2009/0186267 suggests that these materials could be used for the manufacture of a battery, there is no data in this document to suggest that a battery has actually been manufactured.

Kim et al teaches the preparation of three-dimensional porous silicon particles for use in high performance lithium secondary batteries in Angewandte Chemie Int. Ed. 2008, 47, 10151-10154. Porous silicon particles are prepared by thermally annealing composites of butyl capped silicon gels and silica (SiO2) nano-particles at 900° C. under an argon atmosphere and etching the silica particles out of the annealed product to give a carbon coated porous amorphous silicon particle having a pore wall thickness of 40 nm, pore diameters of the order of 200 nm and an overall particle size of greater than 20 µm. Silicon crystallites having a diameter of less than 5 nm were observed within the structure. Half cells prepared using these amorphous porous particles exhibited improved first cycling efficiency, which was thought to be due to the carbon coating. It was also suggested that an amorphous silicon structure could act as a buffer against the expansion of crystalline silicon upon intercalation or insertion.

Although anode structures comprising silicon fibres, rods and wires have been found to exhibit both a better capacity retention and an improved cycle life compared to bulk silicon and silicon powder anodes, an improvement in their absolute capacity and cycle life is still desired. Depending on the shape and dimension of the silicon elements, there can be a limit to the achievable packing density in the composite mix which can restrict the maximum achievable electrode capacity. Furthermore, the methods and costs associated with the manufacture of these silicon structures needs to be further refined and reduced respectively. Even with inherent porosity, electrode structures comprising silicon fibres, rods and wires have been observed to exhibit an effect known as "heave" in which the bulk of the silicon electrode material expands away from the surface current collector during intercalation, which may result in delamination. This bulk does appear to survive the heave process and is able to substantially resume its original configuration on release of the lithium from the silicon fibres, but it exerts pressure on other cell components during cycling.

Further it has been found to be difficult to prepare anode structures comprising porous silicon particles that are able to provide adequate performance in terms of absolute capacity, capacity retention and cycle-ability. Anode structures comprising porous particles of diameter less than 500 nm, for example, do not exhibit good capacity characteristics because the particle pores are generally too small to facilitate electrolyte penetration and efficient intercalation or insertion and release of lithium into the silicon structure. Further, the small particles tend to agglomerate within the electrode structure, which leads to delamination over a number of charging and discharging cycles. In addition because the pore wall thickness (average thickness of material separating any one void or pore within a particle structure from its adjacent pore or void) of these particles tends to be very low (less than 50 nm), their associated surface area tends to be high. A high surface area is associated with significant first cycle losses of lithium in the electrode structure due to the formation of an excessive Solid Electrolyte Interphase layer (SEI) as a result of the consumption of lithium in the formation of these layers. Particles containing pores of a sufficiently large size to accommodate electrolyte penetration and which have thicker pore walls of 0.1 to 2 µm tend themselves to have diameters that are too large to be successfully accommodated into an electrode structure having an overall uniform thickness of around 50 µm.

The fibres or wires used in the formation of silicon mesh electrode structures are also believed to have a high surface area to volume ratio. These mesh like electrode structures are also believed to be associated with high first cycle losses for the reasons given above.

It will be appreciated from the foregoing that the majority of approaches used to date for creating porous particles result in the production of approximately spheroidal-shaped particles with relatively smooth curved surfaces. Such shapes are not ideal for creating networks of electronically connected particles in an electrode. This is because the surface area of contact between one spheroidal particle and another or between one spheroidal particle and a conductive additive particle is small; this means that the electronic conductivity throughout the connected mass of active particles is relatively low, reducing performance.

Many of the electrodes produced using the electro-active silicon materials discussed herein above are not able to exhibit the characteristics of uniform thickness, homogeneity and porosity. Such electrodes do not comprise a strongly connected network of active particles that are able to accommodate the expansion and contraction of the silicon material into its own volume without cracking or de-lamination during the charging cycles of the battery.

There is a need, therefore, for an electroactive material and an electrode structure that addresses the problems associated with the silicon based electrodes outlined above.

2. COMPOSITIONS COMPRISING POROUS PARTICLE FRAGMENTS

A first aspect of the invention provides a composition comprising a plurality of electroactive porous particle fragments comprising an electroactive material selected from the group comprising silicon, tin, germanium, gallium, aluminium and lead. Preferably the porous particle fragments comprise silicon (which will hereafter also be referred to as silicon containing porous particle fragments). By the term "porous particle" it should be understood to include a particle comprising a plurality of pores, voids or channels within a particle structure, wherein each of the pores, voids or channels within the particle structure is defined, bound, partially bound or separated by the electroactive material from which the particle is formed. The term "porous particle" should also be understood to include a particulate material comprising a random or ordered network of linear, branched or layered elongate elements, wherein one or more discrete or interconnected void spaces or channels are defined between the elongate elements of the network; the elongate elements suitably include linear, branched or layered fibres, tubes, wires, pillars, rods, ribbons or flakes. Layered elongate elements include structures in which the elongate elements are fused together. The individual branched elongate elements typically have a smallest dimension in the range 50 to 100 nm with branches every 100 to 400 nm. The porous particles from which the porous particle fragments are derived can further be defined in terms of a smallest dimension (or pore wall thickness), this being the average thickness of material separating any one pore or void within a pore containing porous particle structure from an adjacent void, or where the particle comprises a network of elongate elements, the average thickness (this being the average smallest dimension) of an elongate element within the network. By the term porous particle fragment it should be understood to include all fragments derived from a porous particle, preferably a porous particle formed from an electroactive material such as silicon, tin, germanium, gallium, aluminium and lead. Silicon containing porous particles are especially preferred. Such fragments include structures having a substantially irregular shape and surface morphology, these structures being derived from the electroactive material originally defining, bounding, partially bounding or separating the pores or network of pores within the porous particle from which the fragment structures are derived, without themselves comprising pores, channels or a network of pores or channels. Preferably these fragments are derived from the electroactive material, preferably the silicon material either (a) defining the network of elongate elements or (b) originally defining bounding, partially bounding or separating the pores or network of pores within the porous particle from which the fragment structures are derived, without the fragments themselves comprising pores, channels or a network of pores or channels. These fragments will hereafter be referred to as fractals. The appearance of the fractals may or may not resemble the porous particles from which they are derived. Typically the term "fractal" as described herein describes a structure obtained through the random fragmentation of a larger porous particle. The surface morphology of these fractal structures (which are devoid of pores or channels or a network of pores or channels) may include an ordered or disordered array of indentations or irregularities arising from the pores or channels or network of pores or channels originally bound or partially bound by the electroactive material structure, preferably the silicon structure of the parent porous particle. These fractal fragments will typically be characterised by the presence of peaks and troughs extending over the surface thereof and will include particles having a spiky appearance as well as those including a plurality of ridges or bumps extending from the surface of the particle. The peaks are characterised by a peak height and a peak width. The peak height is defined as the distance between the base of the peak (the place where the peak merges with the body of the fractal) and the apex of the peak. The peak width is defined as the minimum distance between one side of the peak and the other at half height. The fractal can also be defined by the average thickness of the fractal body; this value is typically identical to the average thickness (smallest dimension) of an elongate element derived from a porous particle comprising a network of elongate elements or the average thickness (preferably the pore wall thickness) of the electroactive material originally separating any two adjacent pores within the pore containing porous particle from which the fractal is derived.

The term porous particle fragment also includes porous particle fragments comprising a network of pores and/or channels defined and separated by the electroactive material defining the walls of the particle. Pore-containing porous particle fragments can also be defined in terms of the average thickness of the electroactive material separating two adjacent pore structures within the parent particle (also referred to herein as the pore wall thickness). Preferably the electroactive material is a silicon containing electroactive material and the term "silicon-containing electroactive material" should be interpreted to include electroactive materials comprising essentially substantially pure or metallurgical grade silicon, alloys of silicon with both electro-active and non-electroactive elements as well as materials comprising electroactive compounds of silicon. Suitable silicon alloys include alloys of silicon with one or more metallic elements selected from aluminium, copper, titanium, strontium, nickel, iron, antimony, chromium, cobalt, tin, gold, silver, beryllium, molybdenum, zirconium and vanadium. These fragments will herein after be referred to as pore containing fragments. By the term "pore" or "channel" as defined in relation to the particles from which the fragments are derived as well as the porous particle fragments themselves, it should be understood to mean a void or channel enclosed or partially enclosed within the total volume of the particle as well as a channel extending into the interior of the particle from its surface. These pore and/or channel comprising porous particle fragments are also generally but not exclusively characterised by an irregular shape and surface morphology. In contrast, the particles from which the fragments are derived are generally but not exclusively characterised by a disc-like or substantially spherical shape and a relatively smooth outer surface morphology (inbetween the surface voids). Where the fractals and pore containing porous particle fragments are described together hereinafter they will collectively be referred to as either porous particle fragments or silicon containing porous particle fragments as appropriate. The network of pores and/or channels suitably comprises a three dimensional arrangement of pores and/or channels extending through the volume of the particle in which the pore and/or channel openings are provided on two or more planes over the surface of the pore containing porous particle fragment.

As indicated above, the porous particle fragments comprising the composition of the first aspect of the invention suitably comprise an electroactive material selected from the group silicon, tin, germanium, gallium, aluminium and lead and mixtures thereof as well as alloys of these elements with each other and/or with other electroactive or non-electroactive elements, providing the composition still exhibits electroactive properties. Silicon-containing electroactive materials are preferred. The silicon-containing porous particle fragments may be in the form of an alloy with or include additives such as Al, Sb, Cu, Mg, Zn, Mn, Cr, Co, Ti, V, Mo, Ni, Be, Zr, Fe, Na, Sr and P. Preferably the electroactive material is silicon, tin, aluminium or gallium. More preferably the electroactive material is an alloy of silicon and aluminium. Porous particle fragments comprising silicon or a silicon aluminium alloy are especially preferred. Porous silicon particle fragments prepared from porous particles, which porous particles were formed by etching particles of an aluminium silicon alloy comprising from 11 to 30 wt % silicon, for example 12 wt %, 26 wt %, 27 wt % and 30 wt % silicon and fabricated using either a gas atomisation or melt spinning technique are especially preferred. The nature of the porous particles will in turn depend upon the technique used to fabricate the alloy particles and the processing conditions employed, the composition of the alloy and the particle size of the alloy droplets. Fragments prepared from porous particles formed by etching alloy particles of diameter less than 90 µm made using a gas atomisation technique and comprising up to 12 wt % silicon are characterised by a network of fine silicon structures having a fractal thickness of from 50 to 100 nm. Fragments prepared by etching alloy particles of diameter 90 to 1500 µm formed using either the gas atomisation technique or the melt spinning technique and comprising up to 12 wt % silicon are characterised by a coarser network of silicon structures having a fractal thickness of from 100 to 200 nm. Fragments prepared by etching alloy particles of a similar diameter but containing a hypereutectic concentration of silicon, e.g. 12 to 30 wt % silicon, have similar dimensional characteristics but with the addition of low aspect ratio crystalline silicon particles with typical dimensions of 1-3 µm. Compositions comprising silicon structures having a fractal thickness of from 100 to 200 nm are particularly preferred. The invention will hereafter be described with reference to electroactive materials comprising silicon and alloys thereof and will typically be referred to as silicon-containing porous particles fragments. It should, however, be appreciated that although silicon-containing porous particle fragments as described herein above are especially preferred, the present invention extends to porous particle fragments comprising alternative electroactive materials such as tin, germanium, gallium, aluminium and lead and the term "silicon-containing" should be interpreted to extend in the context of the present invention to electroactive materials comprising tin, germanium, gallium, aluminium and lead.

The composition of the first aspect of the invention is an electroactive material that is able to form an alloy with lithium (either by insertion and/or by intercalation) and which can also be used in the fabrication of anodes for use in lithium ion secondary batteries or batteries based around alternative ions as the charge carrier, for example alkali metal ions such as sodium or potassium ions or magnesium ion batteries. By the term "electroactive material" it should be understood to mean that the material is able to accommodate and release lithium or other alkali metal ions, or magnesium ions into or from its structure during the charging and discharging cycles of a battery.

Suitably the composition according to the first aspect of the invention is provided in the form of an electrode material, preferably a composite electrode material, which is connected or applied to a current collector and used in the manufacture of an electrode. By the term "electrode material" it should be understood to mean a material comprising an electroactive material, which can be applied, bonded, adhered or connected to a current collector. By the term "composite electrode material" it should be understood to mean a material comprising a mixture, preferably a substantially homogeneous mixture, of an electroactive material, a binder and optionally one or more further ingredients selected from the group comprising a conductive material, a viscosity adjuster, a cross-linking accelerator, a coupling agent and an adhesive accelerator. The components of the composite material are suitably mixed together to form a homogeneous composite electrode material that can be applied as a coating to a substrate or current collector to form a composite electrode layer. Preferably the components of the composite electrode material are mixed with a solvent to form an electrode mix, which electrode mix can then be applied to a substrate or current collector and dried to form the composite electrode material.

By the term "electrode mix" it should be understood to mean compositions including a slurry or dispersion of an electroactive material in a solution of a binder as a carrier or solvent. It should also be understood to mean a slurry or dispersion of an electroactive material and a binder in a solvent or liquid carrier.

Further the term "composite electrode" should, in the context of the present invention, be understood to mean an electrode structure comprising a current collector having an electroactive material or a composite electrode material applied, bonded, adhered or connected thereto. The current collector may be provided in the form of a sheet or a mesh. The electroactive material may be in the form of a coating applied thereto. The coating may be provided in the form of a felt or a mat, the felt or mat being applied, bonded, adhered or connected to the current collector.

In a first preferred embodiment of the first aspect of the invention, the silicon containing porous particle fragments are fractals. Without wishing to be constrained by theory, it is believed that composite electrodes comprising fractals are associated with a greater capacity, improved cycle-ability (cycling characteristics) and an optimum porosity compared to bulk silicon and silicon powder composite electrodes, for example. The fractals are believed to pack together more closely within the electrode structure compared to non-fragmented spherical particles. This close packing is believed to contribute to an improved capacity. The irregular surface morphology of the fractals is believed to contribute to both improved connectivity and improved porosity within the electrode structure. The presence of peaks on the surface of the fractals provides contact points on each fractal surface for connection to other electroactive and conductive components within an electrode mix. In addition, the irregular surface morphology means that a number of voids will be created within the electrode structure as a result of the incomplete overlap of the fractals either with each other or with the other components of the electrode structure with which they are packed.

It has been found that the structure of the fractal material depends on the structure of the porous particle from which it is derived (parent porous particle). The structure of the parent porous particle depends upon the composition of the material from which it is formed and the method of formation. If the parent porous particles are prepared from alloy particles, such as a silicon aluminium alloy, the particle structure will depend on both the alloy composition and the method used to form the alloy particle. Cooling techniques (and variations of the cooling rates employed in the techniques) such as gas atomisation techniques and melt spinning techniques can be used to form alloy particles of different dimensions and morphologies. The range of achievable cooling rates will vary with each technique. In general, faster cooling rates will tend to produce finer morphologies in the final fractal material though the overall size of the alloy particles can also have an effect. The use of the gas atomisation technique typically produces particles having finer morphologies that those produced using melt spinning. Finer morphologies are also observed in alloy particles prepared from eutectic alloy compositions compared to hypereutectic compositions.

Compositions having fine silicon structures (fractal thickness of 50 to 100 nm) were prepared by cooling silicon aluminium alloys comprising 12 wt % silicon using a gas atomisation technique and selecting the alloy particles having a diameter of 10 μm to 90 μm for etching to form the porous particles. Coarser silicon structures (fractal thickness of 100 to 200 nm) were prepared by either cooling silicon aluminium alloys comprising 12 wt % silicon using a gas atomisation technique and selecting the alloy particles having a diameter in the range 90 to 1500 μm or through the use of a melt spinning technique.

Coarser silicon structures having a fractal thickness of from 100 nm to 200 nm were also prepared by cooling silicon aluminium alloys comprising 27 to 30 wt % silicon using either a gas atomisation or melt spinning technique.

The dimensions of the silicon containing porous particle fragments suitability facilitate their accommodation into an anode having an active layer thickness (excluding any current collector or supporting substrate) of the order of 40 μm, without compromising the anode structure and capacity. Because the silicon containing porous particle fragments are relatively small, they are inherently suitable for use in the preparation of a homogenous electrode or anode material that can be used to provide a smooth and continuous electrode coating or mat.

2.2 Characteristics of Porous Particle Fragments

As indicated above, the porous particle fragments according to the first aspect of the invention are suitably characterised by an average pore wall or fractal thickness of between 50 nm and 2 μm, preferably 100 nm to 1 μm, especially 100 nm to 200 nm. Suitably porous particle fragments having a pore wall or fractal thickness in the range 50 nm to 2 μm, preferably 100 nm to 1 μm, especially 100 nm to 200 nm comprise at least 10% of the volume of the porous particle fragments used in the composition of the first aspect of the invention.

Preferably porous particle fragments having a pore wall or fractal thickness in the range 50 nm to 2 μm, preferably 100 nm to 1 μm, especially 100 nm to 200 nm comprise at least 30% of the volume of the porous particle fragments used in the composition of the first aspect of the invention. More preferably porous particle fragments having a pore wall or fractal thickness in the range 50 nm to 2 μm, preferably 100 nm to 1 μm, especially 100 nm to 200 nm comprise at least 50% of the volume of the porous particle fragments used in the composition of the first aspect of the invention. Most preferably porous particle fragments having a pore wall or fractal thickness in the range 50 nm to 2 μm, preferably 100 nm to 1 μm, especially 100 nm to 200 nm comprise at least 70% of the volume of the porous particle fragments used in the composition of the first aspect of the invention. It is especially preferred that porous particle fragments having a pore wall or fractal thickness in the range 50 nm to 2 μm, preferably 100 nm to 1 μm, especially 100 nm to 200 nm comprise at least 90% of the volume of the porous particle fragments used in the composition of the first aspect of the invention. In a most preferred embodiment of the first aspect of the invention porous particle fragments having a pore wall or fractal thickness in the range 50 nm to 2 μm, preferably 100 nm to 1 μm, especially 100 nm to 200 nm comprise 10 to 100% of the volume of the porous particle fragments used in the composition of the first aspect of the invention, preferably 30 to 100%, more preferably 50 to 90% and especially 70 to 90%.

The size of the particle fragments is suitably determined using laser diffraction techniques that can be carried out using instruments such as the Malvern Master Sizer™. Such techniques are well known to a skilled person. Laser diffraction calculates the equivalent diameter of a sphere having the same volume as a non-spherical particle and provides a volume distribution of the particles within a sample. Alternative techniques that can be used to measure size distributions include digital imaging and processing such as Malvern Morphologi™ where the diameter of a sphere or ellipse of a particle of the same projected cross-sectional area of the particle being measured is calculated and a number or volume distribution of a sample can be provided. The pore sizes of the pore containing porous particle fragments suitably accommodates both the expansion of the pore wall on intercalation or insertion of silicon and the penetration of electrolyte during the charging and discharging cycles of the battery. The thickness of the fractal material and that of the pore walls for both the fractals and pore containing porous particle fragments respectively is believed to be an important parameter in the context of the present invention and needs to be sufficient to impart to the anode structure, of which it forms a part, enough capacity to reversibly intercalate and release lithium. The pore wall thickness and the thickness of the fractal material must not be too thin as this would lead to excessive lithium loss due to the formation of an SEI layer and high first cycle losses. However, the fractal material and that of the pore walls must not be too thick as this would lead to a build-up of stress within the structure, which can cause the particle to crumble, and an increased resistance to the passage of ions into the bulk of the silicon. In this respect, the facile fabrication of a good quality homogeneous coating or mat requires the use of silicon containing porous fragments having a maximum overall dimension in the range 1 to 40 μm, preferably 1 to 20 μm and especially 3 to 10 μm. Porous particle fragments having diameters of less than 50 nm are less preferred as particles of this size tend to agglomerate, which results in the formation of an inhomogeneous mat or coating. Suitably porous particle fragments having a maximum overall dimension in the range 1 to 40 μm, preferably 1 to 20 μm and especially 3 to 10 μm comprise at least 10% of the volume of the porous particle fragments used in the composition of the first aspect of the invention. Preferably porous particle fragments having a maximum overall dimension in the range 1 to 40 μm, preferably 1 to 20 μm and especially 3 to 10 μm comprise at least 30% of the volume of the porous particle fragments used in the composition of the first aspect of the invention. More preferably porous particle fragments having a maximum overall dimension in the range 1 to 40 μm, preferably 1 to 20 μm and especially 3 to 10 μm comprise at least 50% of the volume of the porous particle fragments used in the composition of the first aspect of the invention. It is especially preferred that porous particle fragments having a maximum overall dimension in the range 1 to 40 μm, preferably 1 to 20 μm and especially 3 to 10 μm comprise at least 70% of the volume of the porous particle fragments used in the composition of the first aspect of the invention. Where the silicon containing porous particle fragment is a pore containing fragment, each pore containing fragment comprises a three dimensional arrangement of pores having pore diameters in the range 60 nm to 10 μm, preferably 100 nm to 5 μm and especially 150 nm to 2 μm. The fractal material and the walls separating the pores within the porous particle fragments suitably have a thickness in the range 0.05 to 2 μm, preferably 0.1 to 1 μm, especially 100 nm to 200 nm.

Typically the ratio of pore diameter to wall thickness for pore containing fragments is suitably greater than 2.5:1 and is preferably in the range 3:1 to 25:1. The ratio of the volume of the pores to the volume of the fragment (otherwise known as particle porosity) is suitably in the range 0.2 to 0.8, preferably 0.25 to 0.75 and especially 0.3 to 0.7.

The porous particle fragments suitably have a BET surface area of greater than 0.5 $m^2/g$, preferably at least 5 $m^2/g$. A higher surface area improves the electrical connectivity and ionic reactivity of the fragments as the active material in an electrode and generally increases the rate at which lithium can be inserted into the silicon. However a higher surface area leads to a larger amount of SEI layer being formed during charge and discharge of the electrode and consequently a higher lithium loss and reduced cycle life of the electrochemical cell. Therefore a suitable balance needs to be made between these competing effects. Accordingly, preferably the porous particle fragments have a surface area of less than 50 $m^2/g$, more preferably less than 30 $m^2/g$. Preferred porous particle fragments having a BET surface area in the range 4 to 50 $m^2/g$, more preferably 4 to 40 $m^2/g$, especially 5 to 30 $m^2/g$. Silicon structures prepared from melt spun 12 wt % Si—Al alloy were found to have a BET surface area in the range 10.51 to 15.97 $m^2/g$. Silicon structures prepared from around 90-1500 μm alloy particles prepared by gas atomisation of a silicon aluminium alloy comprising 12 wt % silicon and having a fractal thickness of 100 to 200 nm are typically characterised by a BET surface area of 7 to 22 $m^2/g$. However finer silicon structures prepared from 10-90 μm alloy particles prepared by gas atomisation of a silicon aluminium alloy comprising 12 wt % silicon typically have a higher BET for example in the region of 40 to 70 $m^2/g$, depending on the mix of the alloy particle dimensions in the measured sample. BET values around the upper end of this range are less preferred. Silicon structures prepared from alloy particles prepared by gas atomisation of a silicon aluminium alloy comprising 30 wt % silicon and having a fractal thickness of 100 to 200 nm are typically characterised by a BET surface area of 10 to 15 $m^2/g$. Pore diameters and BET surface area values for pore containing porous particle fragments and fractals can be measured using both mercury and gas adsorption porosimetry techniques that are well known to a person skilled in the art. Mercury porosimetry can be used to determine the pore size distribution, the pore volume, the pore area and porosity of both a meso-porous (pore size of between 2 to 50 nm) and a macro-porous (pore size of greater than 50 nm) sample. Gas adsorption porosimetry (using gases such as helium, argon or nitrogen, preferably nitrogen) can be used to determine the specific surface area and porosity of microporous sample (down to pore size of 2 nm or less). The specific surface area and porosity of compositions comprising porous particle fragments according to the first aspect of the invention can suitably be measured using mercury porosimetry techniques.

The porosity of the particle should be distinguished from the porosity of the composition of the first aspect of the invention. Particle porosity is (as indicated above) defined by the ratio of the volume of the pores to the total volume of the particle. Where the porous particle fragments are prepared by alloy etching, the particle porosity can most easily be determined by knowing the density of the alloy particle from the compositional ratios and comparing the mass of a sample before and after the etching and partial crushing steps, if all the metal matrix (e.g. aluminium) material is removed during etching. Tap density measurements before and after etching can also provide comparative values of particle porosity. The composition porosity can be defined as the ratio of the volume of voids in the composition to the total volume of the composition and is the sum of both the particle porosity and the packing density of the porous particle fragments and other elements within the composition. Where the composition comprises fractals only, the composition porosity defines the bulk porosity of the fractals per se; the fractals do not have significant inherent porosity.

The silicon containing porous particle fragments can further be characterised by one or more parameters including bulk resistivity, powder resistivity, Seebeck Coefficient, and the 111 plane lattice spacing and crystallite size of the silicon crystallites within the silicon material as measured by X-ray diffraction spectrometry.

The Seebeck Coefficient of the porous particle fragments or fractals can be measured by placing a sample of the particle fragments in a circular pressure cell of approximate dimensions 5 mm diameter by 5 mm thick and applying a pressure of 40 MPa. A small temperature gradient is then formed across the thickness direction of the cell using a heater in the cell base. Measurement of the resulting thermal voltage generated across the cell thickness provides the Seebeck Coefficient, S, in V/K at room temperature (e.g. 21 deg C.). For a material such as silicon, the Seebeck Coefficient is dependent on the carrier density, i.e. the number of free electrons or holes with the silicon. The sign of S depends on the type of the majority carrier—it is positive for p-type (holes) and negative for n-type (electrons). A smaller magnitude of S relates to a higher carrier density indicating a higher level of doping and a higher conductivity. For the active material of a electrochemical cell electrode, a higher conductivity and therefore, a lower value of S is preferred. Preferably the absolute magnitude of S (at room temperature, |S|) is less than 300 μV/K, more preferably less than 250 μv/k and especially less than 100 μV/K. The method of making porous particle fragments described herein where a molten alloy comprising an active material and a metal matrix material is rapidly quenched to form alloy particles from which the metal matrix material is removed by etching, is particularly advantageous in producing an active material with a low Seebeck Coefficient (plus a high level of doping and low resistivity) when the metal matrix material in the alloy comprises a doping element of the active material.

Making porous particle fragments from Al—Si alloy particles is preferred because aluminium is a p-type dopant for silicon and this produces a very highly doped silicon material which is believed to be beneficial for electrode, performance without the need for any additional doping process step.

Where the silicon containing porous particle fragments are characterised in terms of their resistivity, this is value may be determined for a bulk sample (suitably, but not exclusively, a sintered bulk sample) including these materials. Suitably a bulk sample of the porous particle fragments has a resistivity of less than 10 Ω/cm, preferably less than 1 Ω/cm, more preferably less than 0.1 Ω/cm and especially less than 0.01 Ω/cm.

The bulk resistivity of the silicon porous particle fragments can also be estimated from the measurement of the Seebeck Coefficient, S. A suitable method is as follows: the carrier density, p, is calculated using the equation $S=(k/q)*(2.5-\ln(p/Nv))$ where $Nv=1.8 \times 10^{19}/cm^3$, k is Boltzmann's constant ($1.38065 \times 10^{-23}$ J/K) and q is the elementary charge of an electron ($1.602176 \times 10^{-19}$ C). Using the calculated value of the carrier density, the resistivity can be estimated using one of the methods described in ASTM Standard F723-99 using the assumptions that the dopant density is equal to the carrier density and the conversion factors given in ASTM F723-99 for boron doped silicon can be used for aluminium doped silicon. For the calculations given herein, the graphical method for boron doped silicon using the resistivity-dopant density conversion from Thurber et al., NBS special Publication 400-64 (April 1981), as described in ASTM F723-99, is used.

The tap density refers to the bulk density of a powder comprising porous particle fragments after a specified compaction process, usually involving vibration of container holding a sample of the powder. For a bulk sample comprising porous particle fragments typical tap densities after 6000 taps are in the range of 0.1 to 0.6 g/cm$^3$.

X-ray diffraction spectrometry analysis provides an indication regarding the crystallinity and average crystallite size of a sample. X-ray diffraction spectrometry analysis (using an X-ray wavelength of 1.5456 nm) of the porous particle fragments of the present invention indicates that the fragments comprise a polycrystalline material having a crystallite size of between 45 and 55 nm with a crystal plane 111 lattice spacing of between 3.14 and 3.16 Å. The crystallite size is calculated using the Scherrer equation where the shape constant K is taken to be 0.94. Silicon material prepared from a gas atomised 12 wt % silicon aluminium alloy particles of size 10-90 μm (that typically produce finer particle fragments with higher BET values) is typically characterised by a crystallite size of 51 nm and a crystal plane 111 lattice spacing of 3.156 Å. Silicon material prepared from gas atomised or melt spun 12 wt % silicon aluminium alloy particles of size 90 to 1500 μm (that typically produce coarser particle fragments with lower BET values) is typically characterised by a crystallite size of 45.5 nm and a crystal plane 111 lattice spacing of 3.145 Å. Silicon material prepared from a melt spun 30 wt % silicon aluminium alloy that also typically produces coarser particle fragments with lower BET values is typically characterised by a crystallite size of 49.2 nm and a crystal plane 111 lattice spacing of 3.142 Å. The silicon material with a 111 lattice spacing of less than 1.5 Å is preferred. It would appear that the porous particle fragments prepared from rapidly cooling and then etching silicon aluminium alloys comprising from 12 to 30 wt % possess significant crystallinity. Porous particle fragments with a crystallite size of at least 20 nm are preferred, more preferably at least 30 nm.

2.2.1 Characterisation of Parent Porous Particles

As indicated, the silicon containing porous particle fragments of the composition of the first aspect of the invention are suitably derived from larger porous particles (including porous particles comprising a network of elongate elements) having a diameter in excess of 40 μm, preferably at least 60 μm and more preferably at least 100 μm. Porous particles having diameters up to 1000 μm or 1500 μm can also be used to prepare the porous particle fragments according to the first aspect of the invention. Preferably the porous particle fragments are derived from porous particles (including porous particles comprising a network of elongate elements) having a diameter in the range 40 to 200 μm, preferably 60 to 80 μm, more preferably 70 to 150 μm and especially 100 to 150 μm. Preferably the porous particle fragments of the first aspect of the invention are prepared from porous particles (including porous particles comprising a network of elongate elements) having a diameter in the range 60 to 1500 μm, more preferably 150 to 1000 μm. Preferably the fragments are derived from spheroidal and non-spheroidal-based larger porous particles (including porous particles comprising a network of elongate elements) and have, themselves, an essentially non-spheroidal shape with one or more surfaces of low curvature. Preferably the fragments have an average smallest dimension (pore wall thickness or elongate element thickness) which is less than half the value of the largest dimension (usually length). It has been found that anodes prepared using particle fragments of the type and dimensions specified above, which themselves have been derived from larger porous particles having a diameter specified above exhibit improved capacity and cycling characteristics compared to bulk and powdered silicon anodes and anodes comprising whole porous particles as an active material. Without wishing to be constrained by theory it is believed that the superior characteristics of an anode fabricated from porous particle fragments according to the first aspect of the invention are due in part to factors such as overall particle size, surface morphology, pore wall thickness or elongate element thickness (as defined herein above), shape and packing density that are believed to be associated with fragments derived from larger porous particles. In particular, it is believed that due to their non-spheroidal shape and irregular surface morphology, the porous particle fragments of the first aspect of the invention are characterised by a greater packing density within the electrode structure compared to the porous particles from which they are derived due to a greater overlap of fragments compared to the particles from which they are derived. The irregular surface morphology is also thought to improve the connectivity between the electroactive and conductive elements within the electrode structure compared to the porous particles from which they are derived due to the additional connections created by the peaks and troughs on the surface of the fragment structure; it is also thought to be responsible for the porosity of the electrode. It has been found, for example, that it is very difficult to prepare porous particles fragments suitable for use as anode materials using whole porous particles having an average diameter of less than 40 μm. This is because, for porous particle fragments derived from whole particles having a diameter of less than 40 μm and a porosity in the range 0.2 to 0.8, either the pore size is insufficient to accommodate electrolyte penetration or the pore wall thicknesses is insufficient to minimise losses arising from SEI (surface electrolyte interphase) formation or to impart to the particle the capacity and resilience required to withstand the stresses associated with intercalation or insertion and release of lithium or other ions during cycling of the battery. Although larger whole particles having a diameter of greater than 40 μm, preferably greater than 60 μm, more preferably greater than 100 μm and especially greater than 120 μm (up to and including particle having a diameter of 1000 μm or 1500 μm) and a porosity in the range 0.2 to 0.8 are unsuitable for use as an anode material due to their size (their diameters are comparable to or greater than the thickness of the electrode), the pore size and pore wall thicknesses associated with fragments derived from such particles facilitates both electrolyte penetration and good lithium storage capability. The diameter of the pores within the larger porous particles tend be greater than those in whole particles having a diameter of less than 40 μm. In addition, the pore wall thickness also tends to be greater, which means that the fragments derived from such larger particles have a greater packing density within the electrode structure, a greater capacity for lithium intercalation or insertion compared to smaller particles and (due to the thickness of the fractal material or that of the pore walls) are more resilient. Capacity loss is also minimised due to the reduced surface area per unit volume that is available for formation of an SEI layer for thicker fragments. Furthermore, without wishing to be constrained by theory, it is believed that the porous particle fragments derived from particles having a diameter of greater than 40 μm, preferably greater than 60 μm, more preferably greater than 100 μm, especially greater than 120 μm and up to and including particles having a diameter of 1000 or 1500 μm provide a more open structure to the access of electrolyte into their pores compared to the whole particles and their shape and form promotes better electronic connectivity across the network of active particles in the anode composite. Additionally, it is believed that the shape and form of the fragments leads to a more uniform thickness of the electrode layer and results in an electrode having smoother top surface compared to electrodes fabricated from a layer made with the larger whole porous particles. It is easier to calendar the anode surface (further improving uniformity of thickness and providing some control over packing density) without breaking particles. Composite electrode materials (suitably anode materials) prepared from fragments derived from such particles are therefore associated with improved capacity and cycling characteristics compared to bulk and powdered silicon anodes and greater resilience. In addition because the active silicon mass is able to substantially expand into its own volume (into the voids created by the pores in the pore containing fragments and the troughs on the surface of the fractal), individual particles tend to impinge less on neighbouring particles which reduces the stresses within the electrode structure. Composite electrode materials (suitably anode materials) prepared from silicon containing porous particle fragments of the type described herein above exhibit less build-up of heave over lifetime of the battery compared to silicon fibre containing electrode or anode materials and consequently, a longer battery life has been observed.

2.3 Coatings

The silicon containing porous particle fragments may include a coating. The coating suitably improves one or more of the conductivity, resilience, capacity and lifetime of a battery including a composition according to the first aspect of the invention. The coating may also affect the ease with which the silicon-containing porous particle fragments are dispersed within the electrode mix and their adherence to the other components within the electrode mix (such as the binders). Carbon coatings and coatings formed from lithium salts are preferred. Where the coating is a carbon coating, it is preferably a coating made with carbon, such as graphite, electroactive hard carbon, conductive carbon or carbon black. Coatings comprising a lithium salt include but are not limited to lithium salts selected from the group comprising lithium fluoride, lithium carbonate and the lithium salts obtained through the reaction of lithium ions with cyclic carbonates selected from the group comprising ethylene carbonate, propylene carbonate, diethylene carbonate and vinyl carbonate. Coats are typically applied to the silicon structures to a thickness of between 5 and 40% by weight of the coated silicon structure. Methods of coating silicon particles and elongate elements are known to a person skilled in the art and include chemical vapour deposition, pyrolysis and mechanofusion techniques. Carbon coating of silicon structures through the use of Chemical Vapour Deposition techniques is disclosed in US 2009/0239151 and US 2007/0212538. Pyrolysis methods are disclosed in WO 2005/011030, JP 2008/186732, CN 101442124 and JP 04035760. Without wishing to be constrained by theory, it is believed that carbon coatings are able to assist in controlling the formation and stability of SEI layers on the surface of the anode. Lithium based coatings can be obtained by reacting silicon with a solution of LiF or exposing silicon to a solution comprising a mixture of lithium ions and a cyclic or acyclic carbonate.

2.4 Composite Electrode Material

The silicon containing porous particle fragments of the first aspect of the invention are preferably formed into a composite electrode material, which is suitably provided on the current collector in the form of a cohesive mass in which the short term order of the components of the material is substantially retained over at least 100 charging and discharging cycles of a battery including the composite material. The cohesive mass of the composite electrode material may be provided in the form of a coating or layer, in which the porous particle fragments are arranged in a random or ordered fashion. The coating is typically applied or bonded to a current collector. Alternatively, the composite electrode material may be provided in the form of a felt or mat comprising silicon containing porous particle fragments and fibres of an electroactive or a conductive species which are randomly arranged in a composite material. The felt or mat is typically applied, adhered, bonded or connected to the current collector.

2.4.1 Additional Components of the Composite Electrode Material

The composite electrode material comprising porous particle fragments of the composition of the first aspect of the invention may optionally include, in addition to the silicon, tin, gallium, germanium, aluminium or lead containing porous particle fragments (first electroactive material) referred to herein above, additional components such as a binder, a conductive material and optionally a second electroactive material. Preferably the composition and/or structure of the second electroactive material is different to that of the first electroactive material. Examples of the second electroactive material include but are not limited to graphite, hard carbon, silicon, tin, gallium, germanium, aluminium and lead containing material. In a first preferred embodiment of the first aspect of the invention, the composition comprises a plurality of silicon containing porous particle fragments, a binder, a conductive material and optionally a non-silicon containing electroactive material. Alternatively, in a second preferred embodiment of the first aspect of the invention the composition may also contain, in addition to the components of the composition of the first embodiment, one or more silicon containing components having a minimal or negligible porosity, said components being selected from the group comprising native silicon containing particles; silicon containing tubes, wires, fibres, rods, sheets and ribbons and silicon containing pillared particles. By the term "minimal or negligible porosity" it should be understood to mean silicon structures having a porosity of less than 0.2. The terms "minimally porous silicon containing particles, wires, nano-wires, fibres, rods, sheets and ribbons" may include solid elongate elements such as wires, fibres, rods, sheets, ribbons and particles having a silicon-based core respectively as well as wires, fibres, rods, sheets, ribbons and particles having a silicon coating provided on a core other than silicon. Where the silicon containing elongate elements and particles comprise silicon coated elongate elements, tubes and particles, the cores of these coated elements can be selected from electronically and ionically conductive materials such as carbon, preferably hard carbon or graphite or a suitable metal. The silicon containing elongate elements, tubes and particles can be formed from a silicon, a silicon-alloy or a silicon oxide material. When the elongate elements, tubes and particles are formed from a silicon material they are suitably formed from a silicon material comprising less than 99.99%, preferably less than 99.95% silicon because higher purity silicon is more expensive to process, but have a silicon content of greater than 90% to avoid significant reduction in performance from having high levels of impurities in the cell. When they are silicon-alloy material, the alloy preferably contains at least 50 wt % of silicon, preferably at least 75 wt % silicon, more preferably at least 80 wt % of silicon and especially at least 95 wt %. Suitable alloy materials are disclosed herein above. Alloys of silicon with metals such as aluminium, copper, titanium, nickel, iron, tin, gold and silver are preferred. Preferred alloys have a resistivity of less than 10 Ωcm, preferably less than 1 Ωcm and especially less than 0.1 Ωcm. Where the composition contains one or more silicon containing components in addition to the silicon containing porous particle fragments, it is preferred that one or more these components are themselves electroactive.

2.4.2 Additional Components

As indicated above, additional components such as a binder, a conductive material, a non-silicon containing electroactive material, a viscosity adjuster, a cross-linking accelerator, a coupling agent and an adhesive accelerator may also be present in the mix. These non-silicon containing components generally comprise carbon as a major constituent, but may comprise silicon as a minor constituent. As indicated above, the compositions according to the first and second embodiments are suitably used in the preparation of composite electrodes, preferably composite anodes and for this reason each composition may also be referred to as an electrode material or an anode material respectively. The electrode or anode material is suitably provided as a cohesive mass that can be formed into a free-standing mat that can be connected to a current collector or may be formed as a mat that can be applied, bonded or adhered to a current collector. In order to fabricate an electrode, the electrode or anode material is typically combined with a solvent to form an electrode or anode mix and then cast either directly onto a substrate (for subsequent removal) or directly onto a current collector and subsequently dried to remove the solvent. The electrode or anode mix is preferably prepared by combining whole porous particles as described above with the other components of the electrode or anode mix and a solvent to form a slurry and treating the slurry to partially crush the whole porous particles to give an electrode or anode mix as described herein. The slurry is suitably treated using a high shear mixer, a ball mill mixer or an ultra-sonic probe. When the electrode or anode material is formed into a free-standing mat or applied to a current collector as described above the silicon containing porous particle fragments are randomly connected to each other, either directly or indirectly through any other components present in the mix. By the term connected it should be understood to mean, in relation to composition or composite electrode material of the present invention, that substantially all silicon containing porous particle fragment is in electrical contact, either via physical connections or interfaces, with the electrolyte and optionally with one or more other electroactive elements and/or with one or more conductive elements that may be present in the mix as well as the current collector.

It will be appreciated that where the composition comprises minimally porous silicon structures as described above, these may make contact with each other and also with the silicon containing porous particle fragments during the charging cycle of the battery, due to the expansion in silicon volume arising from lithium intercalation or insertion during the charging cycle. This contact between the components of the electrode or anode material may result in a network having enhanced ionic and electrical conductivity.

The composition may also include metal bridging elements, which promote contact between the electroactive silicon components and which also enhance the connectivity within the electrode structure. One or more metal bridging elements selected from but not limited to the group comprising copper, aluminium, silver and gold may be used. The provision of metal bridging elements is well known to a person skilled in the art and is described in WO 2009/010757.

2.5 Composition Porosity

It will further be appreciated from the foregoing that the anode structures formed from compositions according to the first aspect of the invention possess an inherent porosity arising from both the maximum packing density associated with the components of the electrode material and the inherent porosity of the silicon containing porous particle fragments. By controlling the porosity of the parent porous particles, the degree to which they are fragmented and the relative amounts of porous and minimally porous components (electro-active and non-electroactive) in the electrode material, it is possible to control the bulk porosity of the silicon containing electrode or anode. This control of porosity is important as the overall performance of the electrode relies on providing sufficient voids within the electrode structure to accommodate both the expansion of the silicon material and penetration of electrolyte into the voids during lithiation.

The total volume of the anode material, $V_T$ can be expressed in terms of the volume taken up by the solid elements such as silicon, graphite, conductive material and binder that may be present in the material as well as the volume defined by the empty spaces generated within the material as a result of the random packing of the solid elements. The total volume can therefore be expressed as follows:

$$V_T = V_{Si} + V_B + V_{Si}^P + V_C + V_G + V_P$$

Where $V_T$ is the total volume of the anode material; $V_S$, is the total volume of the minimally porous electro-active silicon elements in the anode material; $V_{Si}^P$ is the volume of the silicon porous particle fragments including the pores contained within them; $V_B$ is the total volume of the binder; $V_C$ is the total volume of conductive material (where present), $V_G$ is the total volume of additional electroactive material (such as graphite, where present) and $V_p$ is the total volume occupied by the pores or voids generated by the packing arrangement of the components of the anode material (excluding the pore volume of the porous particle fragments). The porosity of the anode material is calculated in terms of the total volume of pores or voids present in the anode material as a percentage of the total volume of the anode material. This pore volume is made up of the volume of pores or voids created as a result of the random packing of the components of the anode material into the electrode structure ($V_p$) as well as the volume of pores or voids present within the silicon containing porous particle fragments ($V_p^{Sip}$).

$$\text{Anode Porosity} = \frac{V_p + V_p^{Sip}}{V_T} \times 100$$

It will be further appreciated that because silicon expands by a factor of up to approximately 400% when the material is charged, the porosity of the electrode decreases as a result. The expansion of the other components of the electrode material, such as the binder, conductive material and optional non-silicon containing electroactive materials is negligible in comparison. The silicon of the pore containing porous particle fragments is believed to expand substantially into its pore structure; for fractals, the silicon substantially expands into the surface troughs or indentations. Without being constrained by theory, it is believed that the total porosity of the electrode in the charged state should be in the range 15% to 50%, more preferably 25% to 50% to ensure that electrolyte penetration within the electrode structure is not inhibited.

The porosity of the uncharged electrode material will depend, in part, on the nature of components used in the formation of the anode material and the relative proportions in which they are present. It is important, however, that the nature of the components and the relative proportions in which they are present is sufficient to achieve a porosity of between 15 and 50% when the electrode material is in the charged state. In order to achieve this, the electrode material will typically have a porosity of at least 10%. Suitably the electrode material will have a porosity of less than 75%. The electrode material will typically have a porosity of between 10 to 75%, preferably 20 and 75%, more preferably 20 to 60% and especially 30 to 60% in the uncharged state.

The anode porosity, $V^u_{Sig}$, of an uncharged anode material comprising an electroactive material consisting of a volume of minimally porous silicon, silicon containing porous particle fragments and a further electroactive material can be reduced relative to the anode porosity, $V^u_{Si}$, of an uncharged anode material of equivalent volume comprising an electroactive material comprising only minimally porous silicon and silicon containing porous particle fragments.

This reduction in porosity in the uncharged state can be expressed as follows:

$$V_{Si}^u - V_{Sig}^u = V_G(1 - 1/\alpha)$$

where $V^u_{Sig}$, is the volume occupied by pores in an uncharged material comprising an electroactive material comprising minimally porous silicon, silicon containing porous particle fragments and a further electroactive material, $V^u_{Si}$ is the volume occupied by pores in an uncharged material comprising an electroactive material comprising minimally porous silicon and silicon containing porous particle fragments only, $V_G$ is the volume of the additional electroactive material, and $\alpha$ is volume expansion factor of the silicon-containing electroactive material (in other words, the volume V of the silicon containing electroactive material increases to $\alpha V$ at the end of the charge cycle with the insertion of lithium ions). This calculation assumes that the silicon containing electroactive material has the same volume expansion factor in each case, that the volume expansion of the further electroactive material is minimal and can be neglected and that the porosity of each anode material in the charged state is the same.

Without wishing to be constrained by theory, it is believed that the overall structure of the electrode or anode material of the first aspect of the invention and hence its electrical and mechanical properties will depend upon the relative dimensions, shapes and morphologies of all the components (silicon and non-silicon containing components) from which the material is formed as well as the proportions in which they are present and their individual porosities. In other words, it is believed that the structure of the electrode material will be governed by the packing density, surface morphology and porosities of the components of the material. An electrode material comprising only particulate components will tend to exhibit a higher packing density compared to an electrode material containing a mixture of fibre and particulate components. It will, therefore be appreciated that since the electrode material must accommodate the expansion of silicon during lithium intercalation or insertion in order to minimise the build up of stress within the electrode structure, the porosity of the pore containing porous particle fragments or the morphology of a fractal in a particle only material must be greater or rougher, respectively, than that for pore containing porous particle fragments or fractals in a fibre and powder material, since there is more inherent porosity within a fibre and powder material into which the silicon components can expand.

2.6 Electrode Materials

Without further wishing to be constrained by theory, it is believed that because the pore containing porous particle fragments expand into their own pores and the fractals expand into their surface troughs during lithium intercalation, the volume fraction occupied by the silicon containing porous particle fragment in the electrode structure does not significantly change between the charging and discharging cycles of the battery. By the term "significantly change" it should be understood that the overall volume of the silicon containing porous particle fragment, $V_{Si}^p$, does not increase by more than 150% during the charging cycle. This means that the total volume of an electrode material comprising silicon containing porous particle fragments as the only silicon containing component does not differ significantly between the charged and the uncharged state. Where the electrode material comprises a mixture of silicon containing porous particle fragments and silicon components having minimal porosity, it is believed that the packing density of the electrode material in the uncharged state must be inversely proportional to the volume of minimally porous silicon material present within the anode mix in order to provide sufficient pore volume within the electrode structure to accommodate the expansion of the minimally porous silicon structure upon lithium intercalation or insertion.

An electrode or anode material comprising a composition according to any of the preferred embodiment of the first aspect of the invention will suitably comprise 50 to 90% of an electroactive material by weight of the electrode or anode material, preferably 60 to 80% and especially 70 to 80%.

The electroactive material suitably comprises from 10 to 100% silicon containing porous particle fragments by weight of the electroactive material, preferably from 20 to 100 wt %, more preferably 40 to 100 wt % silicon, most preferably 50 to 90 wt % and especially 60 to 80 wt %. The electroactive material may include additional components selected from the group comprising non-silicon containing electroactive materials; silicon powders; elongate silicon containing elements such as silicon rods, fibres, wires, ribbons and sheets; and silicon containing pillared particles. Examples of further electroactive materials that may be present include graphite and transition metal oxides or chalcogenides such as $MoO_2$, $WO_2$, $MnV_2O_6$ and $TiS_2$; aluminium and its compounds, tin and its compounds; germanium compounds, including germanium nano-wires; and ceramics such as, for example, titanate ceramics and bismuth selenide. These additional components suitably comprises up to 50 wt %, for example from 5 to 40% by weight of the electrode or anode material or mix.

In a preferred embodiment of the first aspect of the invention, the composition comprises, in addition to the silicon containing porous particle fragments, an electroactive carbon material. These electroactive carbons may be present in an amount comprising 8 to 90% of the total weight of the electroacive material, preferably 8 to 80% and especially 8 to 50%. Examples of suitable electroactive carbons include graphite, hard carbon, carbon microbeads and carbon flakes, nanotubes and nanographitic platelets. Suitable graphite materials include natural and synthetic graphite materials having a particle size in the range 5 to 30 µm. Electroactive hard carbon suitably comprises spheroidal particles having a diameter in the range 2 to 50 µm, preferably 20 to 30 µm and an aspect ratio of 1:1 to 2:1. Carbon microbeads having a diameter in the range 2 to 30 µm can be used. Suitable carbon flakes include flakes derived from either graphite or graphene.

In a first more preferred embodiment of the first aspect of the invention, the composition comprises 5 to 40 wt %, preferably 10 to 30 wt % and especially 15 to 25 wt % of silicon-containing electroactive material including silicon-containing porous particle fragments and 60 to 95 wt %, preferably 70 to 90 wt % and especially 75 to 85 wt % of an electroactive carbon material. Preferably an electroactive composition comprising 20 wt % of a silicon-containing electroactive material including silicon-containing porous particle fragments and 80 wt % of graphite can be used to manufacture an electrode material. The silicon-containing electroactive material may include electroactive silicon-containing structures such as native particles, fibres, threads, tubes, wires, nano-wires, pillared particles and the like as well as porous particle fragments. Preferably the silicon-containing electroactive material comprises porous particle fragments.

A second more preferred embodiment of the first aspect of the invention, the composition comprises 60 to 80 wt %, preferably 70 to 80 wt % and especially 80 wt % of silicon-containing porous particle fragments and 20 to 40 wt %, preferably 20 to 30 wt % and especially 20 wt % of an electroactive carbon material. Preferably an electroactive composition comprising 80 wt % of silicon-containing porous particle fragments and 20 wt % of graphite can be used to manufacture an electrode material. The silicon-containing electroactive material may include electroactive silicon-containing structures such as native particles, fibres, threads, tubes, wires, nano-wires, pillared particles and the like as well as porous particle fragments. Preferably the silicon-containing electroactive material comprises porous particle fragments.

The binder is a component used to bind the components of the anode mix together either upon formation of the felt like mat or on application of the components to the current collector. The binder helps to maintain the integrity of the anode mix according to the second aspect of the invention when used in battery cells. It also functions to help adhere the anode mix to the current collector. The binder can be added in an amount of 0 to 30% by weight based on the weight of the anode material. Examples of binders include, but are not limited to, polyvinylidene fluoride, polyacrylic acid, modified polyacrylic acid, carboxymethylcellulose, modified carboxymethylcellulose, polyvinyl alcohol, fluorocopolymers such as copolymers of hexafluoroethylene, polyimide, styrene butadiene rubber and thermo or photo-polymerizable materials including, but not limited to, monomers, oligomers and low molecular weight polymers and mixtures thereof which are polymerizable by light irradiation and/or heat treatment. Examples of polymerizable monomers include epoxy, urethane, acrylate, silicon and hydroxyl based monomers and acrylic derivatives which may be used alone or in combination. Polymerisation of these materials is initiated with light irradiation or heat treatment. The polymerizable oligomer is a polymerisation product of from 2 to 25 monomers and may be formed into polymers having a higher degree of polymerisation by light irradiation or heat treatment. The term polymerisable low molecular weight polymer includes linear polymers and cross-linked polymers having a low degree of polymerisation or a low viscosity. Examples of such polymers include polyester acrylate, epoxy acrylate, urethane acrylate and polyurethane.

Preferably the binder is selected from one or more of a polyacrylic acid, a modified polyacrylic acid or alkali metal salts thereof. Lithium and sodium salts are preferred. Polyacrylic acid binders and sodium polyacrylic acid binders are able to bind to silicon materials containing impurities. The silicon-containing porous particle fragments according to the first aspect of the invention suitably have a silicon purity of between 75% and 100%. Preferably the silicon-containing porous particle fragments have a silicon purity of at least 80%, more preferably at least 95%. It is especially preferred that the silicon-containing porous particle fragments of the composition of the first aspect of the invention have a silicon purity of less than 99.99%, preferably less than 99.95% because these materials can be cheaper and the impurities can improve conductivity within the electrode structure. However if the level of impurities is too high the performance of the active material in the cell can be reduced and it has been found that a purity in the range 90% to 99.99% is preferred, more preferably 90% to 99.95%, especially 95% to 99.9%. It will be appreciated therefore, that the silicon containing porous particle fragments and other silicon containing components used in the preparation of compositions according to the first aspect of the invention may be derived from metallurgical grade silicon. Batteries including electrodes containing compositions of the first aspect of the invention, which include a binder comprising polyacrylic acid, a modified polyacrylic acid or an alkali salt thereof exhibit a significant reduction in first cycle loss.

A particularly preferred embodiment of the first aspect of the invention provides a composition comprising 10 to 95% by weight of silicon containing components, including silicon containing porous particle fragments, 5 to 85% by weight of non-silicon containing components and 0.5 to 15% by weight of a binder comprising polyacrylic acid and/or an alkali metal salt thereof. Preferred alkali metal salts include those derived from lithium, sodium or potassium. Preferably the silicon containing components have a purity in the range 90 to 99.95% or in the range 95 to 99.9%, and optionally in the range 95 to 99.99%.

An especially preferred embodiment according to the first aspect of the invention provides a composition comprising 70 wt % of silicon-containing porous particle fragments, 12 wt % of a binder, 12 wt % graphite and 6 wt % of a conductive carbon. The composition is provided in the form of an electrode material. Half cells prepared using this electrode material as an anode material and charged to either 1200 mAh/g or 1400 mAh/g exhibit a capacity retention of almost 100% over at least 80 cycles.

Half cells including electrode compositions comprising 70 wt % silicon-containing porous particle fragments, 18 wt % of a binder, 4% graphite and 6 wt % of a conductive carbon exhibited a capacity retention of almost 100% when charged to 1400 mAh/g.

A viscosity adjuster is a component used to adjust the viscosity of the anode mix so that the mixing process and the application of the material to a current collector can be easily carried out. The viscosity adjuster can be added in an amount of 0 to 30% by weight based on the total weight of the anode mix. Examples of viscosity adjusters include, but are not limited to, carboxymethylcellulose, polyvinylidene fluoride and polyvinyl alcohol. Where appropriate, in order to adjust the viscosity of the anode mix, a solvent such as N-methylpyrrolidone (NMP) may be used in an amount of 0 to 30% based on the total weight of the anode mix. In this case the solvent is removed before or after any polymerization or curing process.

The compositions of the first aspect of the invention preferably include a conductive material. The conductive material is a component used to further improve the conductivity of the anode material and may be added in an amount of 1 to 20% by weight based on the total weight of the anode mix. There is no particular limit to the conductive material so long as it has suitable conductivity without causing chemical changes in a battery in which it is included. Suitable examples of conductive materials include hard carbon; graphite, such as natural or artificial graphite; carbon blacks such as carbon black, acetylene black, ketjen black, channel black; conductive fibres such as carbon fibres (including carbon nanotubes) and metallic fibre; metallic powders such as carbon fluoride powder, aluminium powder and nickel powder, conductive whiskers such as zinc oxide and potassium titanate; conductive metal oxides such as titanium oxide and polyphenylene derivatives. Suitably the total amount of conductive carbon and electroactive carbon (such as graphite) comprises 0 to 60% of the total electroactive material by weight.

The compositions according to the first aspect of the invention may also include a coupling agent and an adhesive accelerator. The coupling agent is a material used to increase adhesive strength between the active material and the binder and is characterised by having two or more functional groups. The coupling agent may be added in an amount of up to 0 to 30% by weight based on the weight of the binder. There is no particular limit to the coupling agent so long as it is a material in which one functional group forms a chemical bond via reaction with a hydroxyl or carboxyl group present on the surface of the silicon, tin or graphite-based active material, and the other functional group forms a chemical bond via reaction with the nanocomposite according to the present invention. Examples of coupling agents that can be used in the present invention include silane based coupling agents such as triethoxysilylpropyl tetrasulphide, mercaptopropyl triethoxysilane, aminopropyl triethoxysilane, chloropropyl triethoxysilane, vinyl triethoxysilane, methacryloxypropyl triethoxysilane, glycidoxypropyl triethoxysilane, isocyanopropyl triethoxysilane and cyanopropyl triethoxysilane.

The adhesive accelerator may be added in an amount of less than 10% by weight based on the weight of the binder. There is no particular limit to the nature of the adhesive accelerator so long as it is a material that improves the adhesive strength of the anode mix to the current collector. Examples of adhesive accelerators include oxalic acid, adipic acid, formic acid, acrylic acid and derivatives, itaconic acid and derivatives and the like.

2.6.2 Minimally Porous Silicon Containing Additives

As indicated above, the compositions of the first aspect of the invention may also include as an electroactive material one or more minimally porous silicon containing components selected from the group comprising elongate elements; native particles, pillared particles, substrate particles, scaffolds and particles comprising a columnar bundle of nano-rods having a diameter of 50 to 100 nm and a length of 2 to 5 µm, wherein each nano-rod has a diameter of at least 10 nm.

Where the electrode material contains elongate silicon containing elements these can be selected from the group comprising fibres, rods, tubes, wires, nano-wire, ribbons and flakes. The term "fibre" should be understood to include wires, nano-wires, threads, filaments, pillars and rods as described herein below and these terms may be used interchangeably.

However, it should be appreciated that the use of the term "pillar" in the context of the present invention is used to describe an elongate structure such as a fibre, wire, nano-wire, thread, filament or rod which is attached at one end to a particular substrate. Fibres, wires, nano-wires, threads and filaments may in one embodiment be obtained by detaching pillars from the substrate to which they are attached. The term "fibre" should also be understood to mean an element defined by two smaller dimensions and one larger dimension, the aspect ratio of the larger dimension to the smallest dimension being in the range 5:1 to 1000:1. As indicated above, where the material according to the first aspect of the invention includes a silicon containing fibre, this fibre preferably has a diameter in the range 0.05 to 2 µm, preferably 0.1 to 1 µm and especially 0.1 to 0.5 µm. Silicon fibres having a diameter of 0.2 or 0.3 µm are preferred. Silicon containing fibres of the first aspect of the invention suitably have a length in the range 1 µm to 400 µm, preferably 2 µm to 250 µm. Silicon fibres having a length of 20 µm are preferred.

Branched structures may be referred to as bipods, tripods or tetrapods depending upon the number of branches attached to a main stem.

In the context of the foregoing, the term "nano-wire" should be further understood to mean an element having a diameter in the range 1 nm to 500 nm, a length in the range 0.1 µm to 500 µm and an aspect ratio that may be greater than 10, preferably greater than 50 and especially greater than 100. Preferably the nano-wires have a diameter in the range 20 nm to 400 nm, more preferably 20 nm to 200 nm and especially 100 nm. Examples of nano-wires that can be included in the compositions of the present invention are disclosed in US 2010/0297502 and US 2010/0285358.

The term elongate element also includes a pillared particle having one or more pillars provided on the surface thereof, where the pillars have a length in the range 1 to 100 µm. Such pillars may be formed integrally with the particle core or may be formed independently of the particle core. These pillared particles provided as elongate elements should be distinguished from pillared particles having a pillar length of less than 1 to 100 µm.

Alternatively, where the silicon containing elongate elements comprise ribbons, tubes or flakes, these are each suitably defined by three separate dimensions. The ribbon includes a first dimension, which is smaller in size than the other two dimensions; a second dimension, which is larger than the first dimension and a third dimension, which is larger than both the first and second dimension. The flake includes a first dimension, which is smaller in size than the other two dimensions; a second dimension, which is larger than the first dimension and a third dimension, which is similar to or marginally larger than the second dimension. The tube includes a first dimension, the tube wall thickness, which is smaller in size than the other two dimensions, a second dimension, the outer diameter of the tube wall, which is larger than the first dimension and a third dimension, the tube length, which is larger than both the first and second dimension. For ribbons, tubes and flakes, the first dimension is suitably of the order of 0.03 µm to 2 µm, typically 0.08 µm to 2 µm, preferably 0.1 µm to 0.5 µm. The second dimension is suitably at least two or three times larger than the first dimension for ribbons and between 10 and 200 times the first dimension for flakes and between 2.5 and 100 times the first dimension for tubes. The third dimension should be 10 to 200 times as large as the first dimension for both ribbons and flakes and between 10 to 500 times as large as the first dimension for tubes. The total length of the third dimension may be as large as 500 µm, for example.

Ribbons having a typical thickness of 0.125 to 0.5 µm, a width of more than 0.5 µm and a length of 50 µm may be used. Flakes having a thickness of 0.1 to 0.5 µm, a width of 3 µm and a length of 50 µm are also suitable. Tubes having a wall thickness of 0.08 to 0.5 µm, an outer diameter of 0.2 to 5 µm and a length of at least five times the outer diameter are particularly suitable.

The minimally porous silicon containing particles referred to above may be in the form of native particles or pillared particles.

Native particles typically have a principle diameter in the range 0.5 um to 15 µm, preferably 1 to 15 µm, more preferably 3 µm to 10 µm and especially 4 µm to 6 µm. By the term "Pillared Particles" it is to be understood to mean particles comprising a core and a plurality of pillars extending there from, where the pillars have a length in the range 0.5 to 10 µm, preferably 1 to 5 µm. Pillared particles can be prepared by etching silicon particles having dimensions in the range 5 to 40 µm, preferably 15 to 25 µm using the procedure set out in WO 2009/010758. Such pillared particles include particles having a principle diameter in the range 5 to 15 µm, 15 to 25 µm and 25 to 35 µm. Particles having a principle diameter in the range 5 to 15 µm typically include pillars having heights in the range 0.5 to 3 µm. Particles having a principle diameter in the range 15 to 25 µm typically include pillars having heights in the range 1 to 5 µm. Particles having a principle diameter in the range 25 to 35 µm typically include pillars having heights in the range 1 to 10 µm, preferably 1 to 5 µm. The pillared particles can be directly applied to the current collector or can be included in a composite electrode material and may be provided as discrete particles, in the form of a network in which the pillars of one particle overlap or are directly connected to the pillars of another particle in the network or as a mixture of both. The pillared particles are most preferably provided in a composite electrode material in the form of discrete particles which, during the charging and discharging cycles, are able to expand and contract without significantly affecting or impinging upon the expansion and contraction of other pillared particles in the electrode material and which are able to contribute to the continued electrical conductivity of the electrode material over a significant number of charging and discharging cycles.

The silicon containing elongate elements referred to above may be prepared by any suitable methods known to a person skilled in the art. The elongate elements are preferably prepared from single crystalline wafers or from single crystalline, polycrystalline or amorphous silicon particles having a dimension larger than 80 µm.

Silgrain™ polycrystalline silicon particles having dimensions in the range 80 µm to 0.8 mm can be obtained by grinding and sieving any one of the Silgrain materials sold by Elkem of Norway. Suitable Silgrain products that can be used in the preparation of elongate elements (fibres) (and also pillared particles) include Silgrain™ Coarse having dimensions in the range 0.2 to 2 mm, Silgrain™ HQ having dimensions in the range 0.2 to 0.8 mm and Jetmilled Silgrain™ having dimensions in the range 10 to 425 µm. These Silgrain products typically contain from 97.8 to 99.8% silicon and include impurities such as iron, Aluminium, Calcium and Titanium.

The silicon containing native particles, elongate elements and porous particle fragments may comprise pure or impure silicon as described herein, doped silicon or may be in the form of an alloy if the doping exceeds 1 wt % or an intermetallic alloy. Typical dopants include boron, nitrogen, phosphorous, aluminium and germanium.

Pillared particles may also be manufactured using growth techniques such as high and low temperature CVD, vapour solid liquid growth, molecular beam epitaxy, laser ablation and silicon monoxide evaporation to grow fibres on particle cores. Such growth techniques are well known to a skilled person and are set out in JP 2004-281317, US 2010/0285358 and also in Chem. Rev. 2010, 110, 361-388.

By the term "scaffold" it should be understood to mean a three dimensional arrangement of one or more structural elements selected from the group comprising fibres, wires, nano-wires, threads, pillars, rods, flakes, ribbons and tubes, which structures are bonded together at their point of contact. The structural elements may be arranged randomly or non-randomly in the three dimensional arrangement. The three dimensional scaffold may comprise coated or uncoated structures having a core comprising an electroactive material such as silicon, tin, germanium or gallium. Alternatively, the scaffold may be a hetero-structure comprising a three-dimensional arrangement of structures comprising an electroactive or a non-electroactive base scaffold material onto which is deposited small islands, nano-wires or a coating of an electroactive material having a composition different to that of an electroactive material from which the scaffold is formed; preferred scaffolds of this type comprise a network of carbon fibres, threads, wires, ribbons or nano-wires having small islands, nano-wires or a thin film coating of an electroactive material such as silicon, germanium, gallium, tin or alloys or mixtures thereof applied thereto. Where the scaffold comprises a silicon based coating, one or more additional coating layers may be applied thereto. A coating layer may be continuous and extend over substantially the entire surface of the scaffold structure. Alternatively, a coating layer may be discontinuous and may be characterised by an absence of a coating layer over some regions of the surface of the scaffold structure. In one embodiment, the coating material may be distributed randomly or in a set pattern over the surface of the scaffold. Examples of scaffold structures that can be included in the binder compositions of the present invention are disclosed in US 2010/0297502.

Each of the particles, tubes, wires, nano-wires, fibres, rods, sheets and ribbons and scaffolds that can be included in the composite electrode materials used in the manufacture of the battery cells of the present invention may be crystalline, microcrystalline, polycrystalline or amorphous or may include crystalline or polycrystalline regions within an amorphous structure. These structures may be fabricated using etching techniques such as those outlined in WO 2009/010758 or electrospinning as described in US2010/0330419. Alternatively, they can be manufactured using growth techniques such as a catalysed Vapour-Liquid-Solid approach as described in US 2010/0297502. It will be apparent to a skilled person that it is possible to grow nano-particles, nano-wires and nano-tubes on the surface of a conductive substrate such as a carbon particulate substrate using the technique set out in US 2010/0297502.

The minimally porous silicon containing native particles, fibres, tubes, ribbons and/or flakes comprising the material of the first aspect of the invention may also be provided with a coating. Suitable coatings include lithium salts, amorphous carbon, graphitic carbon, hard carbon and carbon based polymers. Suitable lithium salts include lithium fluoride, lithium carbonate and complex salts of cyclic carbonate species such as ethylene carbonate, propylene carbonate, diethylene carbonate and vinyl carbonate with lithium.

Coats are typically applied to the silicon structures to a thickness of between 1 and 30% of the total weight of the silicon/carbon product. Methods of coating silicon particles and elongate elements are known to a person skilled in the art and include mechanical techniques, chemical vapour deposition, and pyrolysis techniques. Carbon coating of silicon structures through the use of Chemical Vapour Deposition techniques is disclosed in US 2009/0239151 and US 2007/0212538. Pyrolysis methods are disclosed in WO 2005/011030, JP 2008/186732, CN 101442124 and JP 04035760.

Where the composition according to the first aspect of the invention comprises one or more components selected from elongate silicon elements, native silicon particles, substrate particles, scaffolds, columnar bundles and pillared particles in addition to the silicon containing porous particle fragments, these are preferably present in an amount comprising 0 to 60% by weight of the electroactive material, either alone or in combination.

3. MANUFACTURE OF STARTING MATERIAL

As indicated above, the porous particles used to fabricate the silicon containing porous particle fragments according to the first aspect of the invention can be readily manufactured using techniques that are well known to a person skilled in the art. Silicon containing porous particles are typically fabricated using techniques such as stain etching of silicon particles or wafers or by etching particles of silicon alloy, such as an alloy of silicon with aluminium. Methods of making such porous particles are well known and are disclosed, for example, in US 2009/0186267, US 2004/0214085 and U.S. Pat. No. 7,569,202. They can also be manufactured by etching particles of a silicon metal alloy to remove the metal and precipitate the porous silicon structure.

The particulate alloy material used to prepare the porous particles from which the porous particle fragments of the present invention are derived are generally prepared using techniques that rapidly quench samples of the molten alloy such as gas atomisation, melt spinning, splat quenching, cold rolling, and laser surface modification, all of which are known to a person skilled in the art. Such preparation techniques followed by etching are preferred for making the parent porous particles but other methods of making the parent porous particles, such as those described above can be used. The structure of the silicon within a rapidly quenched alloy particle depends on factors such as the concentration of the silicon (or other electroactive material) in the alloy, whether modifying additives such as Na, Sr or Ti are present in the alloy and the processing conditions used to form the solid alloy particles from its corresponding molten form. It has been found, for example, that for any particular alloy composition, the morphology of the silicon (or electroactive material) component within the alloy particle depends on factors such as the size of the alloy droplets and the rate of cooling applied to the molten alloy during particle formation. The rate of cooling that can be achieved depends on the techniques used. Where gas atomisation techniques are used to form the alloy particles, the rate of cooling that can be achieved depends upon the nature of the gas used and the velocity at which it impinges the alloy droplets within the reaction chamber. Gas atomisation techniques are generally associated with cooling rates in the range $10^3$ to $10^5$ K/s or faster: the use of cooling rates in this region results in the formation of alloy structures including regions of silicon comprising finely branched silicon structures. These finely branched silicon structures typically comprise tree like structures comprising branched rods of silicon having a diameter in the range 50 to 100 nm, the rods including branches every 100 to 400 nm. Where melt spinning techniques are used the rate of cooling depends on the rotational velocity of the cooled disc onto which the molten alloy particles impinge, the temperature of the disc, surrounding gas and its temperature and the alloy droplet size. Melt spinning techniques are generally associated with a cooling rate in the range $10^2$ to $10^4$ K/s. The use of cooling rates in this region results in the formation of alloy structures including regions of silicon comprising both coarse and fine silicon structures. Silicon structures having a minimum dimension of between 100 nm and 500 nm, preferably between 100 nm and 200 nm and a length in the range 5 to 10 μm have been observed. Alloy additives can also affect the shape and form of the silicon structures. A sodium additive may tend to spheroidise the silicon structures which is not preferred, whilst a combination of Ti and Sr additives may reduce the size of fibre-like structures. Alloys of silicon with aluminium, in which the alloy comprises up to 30% silicon are preferred. Silicon aluminium alloys comprising 12%, 26% and 30% silicon can be used in the fabrication of the porous silicon particles from which the porous particle fragments are derived. The use of silicon aluminium alloys comprising 12% silicon are preferred. However, silicon alloys containing both 27% and 30% silicon as a constituent have also been observed to yield porous particle fragments that can be used in the manufacture of half cells having a capacity retention of almost 100% over more than 80 cycles when charged to 1200 mAh/g or 1400 mAh/g. As indicated above, the precipitated porous silicon structure can be isolated from the bulk alloy by etching away the some or all of the bulk metal, provided the etching method does not etch the silicon structures but does etch the metal. Etchants may be liquid or gaseous phase and may include additives or sub-processes to remove any by-product build up which slows etching. Etching can be done chemically, e.g. (in the case of Al) using ferric chloride, or electrochemically using copper sulphate/sodium chloride electrolytes. The vast majority of known aluminium etchants/methods do not attack the fine Si structures, leaving them intact after a sufficient amount of the aluminium (some or all) has been etched away. Any aluminium or aluminium silicide intermetallics remaining after etching, for example adhering to the crystalline silicon, can be tolerated when the silicon is used to form an anode as they are themselves excellent Li-ion anode candidates, and so long as any aluminium and intermetallic structures have comparable thickness to the silicon they can be expected to survive Li insertion cycling. In fact, aluminium and intermetallics may also aid in making electrical contact between the porous silicon particles and metal electrode. Similar techniques known to a person skilled in the art can be used to manufacture porous particles comprising germanium, gallium, lead or tin or a mixture thereof.

The most common commercially practiced method of bulk aluminium etching involves caustic etching using an etchant containing 10-20% NaOH. The etchant will be selected to prevent substantial attack of the silicon by the etchant. Other etching solutions that can be used to selectively remove the aluminium from the alloy sample include solutions comprising a mixture of nitric acid, hydrochloric acid and hydrofluoric acid as well as solutions comprising a mixture of phosphoric acid, nitric acid and acetic acid. Solutions comprising a mixture of phosphoric acid, nitric acid and acetic acid are generally preferred After partially or fully etching away the metal matrix, the porous silicon structures will be released into the etchant. These will generally need cleaning to remove contaminants, by-products (e.g. aluminium hydroxide in caustic etching)) and remnants generated during etching, which may be achieved using acids or other chemicals, followed by rinsing and separating the porous silicon structures from the liquid, which may be achieved by filtering, centrifuging or other separation method. The porous silicon structures may then be handled in liquid suspension.

Once the porous silicon structures are released and isolated, they can be partially crushed using any suitable technique to give silicon containing porous particle fragments. Suitable techniques for partially crushing the porous silicon structures include ultrasound, a pestle and mortar and ball milling, the use of ultrasound being preferred. Ultrasonic crushing is suitably carried out at or around 27 KHz for 5 minutes using a suspension of silicon in a solvent such as water, in aqueous solutions, in organic solvents such as N-methylpyrrolidone (NMP) or other solvents used in battery manufacture. Ball milling is suitably carried out using a high energy ball mill, an epicyclic ball mill or a standard ball mill, preferably using ceramic balls.

The fragments are then separated according to their size, using either centrifugation or sieving. The fragments are then further cleaned and dried. The isolated particles can be included into an electrode or anode mix and used in the fabrication of an electrode, preferably an anode. The silicon containing porous particle fragments are typically mixed with a binder, a solvent and optionally one or more additional ingredients selected from the group comprising a conductive material, a further electro-active material, a viscosity adjuster, a filler, a cross-linking accelerator, a coupling agent and an adhesive accelerator and coated onto a substrate. The coated substrate is then dried to remove the solvent and calendared and used to form an anode as set-out in WO2007/083155, WO2008/139157, WO2009/010758, WO2009/010759 and WO2009/010757, all incorporated herein by reference.

Although aluminium is preferred as the main component of the silicon alloy from which the silicon structures are precipitated, the skilled person will understand that other metals that will precipitate silicon during alloy cooling and can be etched may be used. Furthermore the skilled person will understand there are ways of foaming metals by injecting gases into the cooling molten mass and this can be applied to Si to create a 'foamed' Si matrix. One such method is described in "*Fabrication of lotus-type porous silicon by unidirectional solidification in hydrogen*" in Materials Science and Engineering A 384 (2004) 373-376. Using techniques such as this potentially allows a skilled person to avoid the need to etch away a sacrificial material to obtain the Si mesh or matrix. Solgel formation methods such as those used with silica to produce Aerogel may also be applied to silicon. The silicon containing components or structures of the composition of the first aspect of the invention suitably comprise a high purity polycrystalline silicon material as well as polycrystalline silicon materials comprising either n-type or p-type dopants as impurities. Polycrystalline silicon materials comprising n-type or p-type dopants are preferred because these materials exhibit a greater conductivity compared to that of high purity polycrystalline silicon. Polycrystalline silicon materials comprising p-type dopants are preferred and can be easily prepared from the aluminium silicon alloys referred to herein or using methods (such as ion implantation) known to a person skilled in the art; these materials suitably include one or more impurities selected from aluminium, boron or gallium as dopants.

4. METHODS OF MAKING POROUS PARTICLE FRAGMENTS

A second aspect of the invention provides a method for fabricating a composition according to the first aspect of the invention, the method comprising the steps of preparing a silicon containing porous particle and partially crushing that particle to give a silicon containing porous particle fragment. In a first preferred embodiment of the second aspect of the invention porous particles having a diameter in the range 10 to 1500 µm, preferably 10 to 1000 µm, more preferably 10 to 200 µm, especially 10 to 100 µm and which are prepared by etching a silicon aluminium alloy as specified above are partially crushed to give silicon containing porous particle fragments having a diameter in the range 1 to 40 µm. The silicon containing porous particles used to prepare the silicon containing porous particle fragments suitably have a porosity in the range 0.2 to 0.8 and an pore wall thickness in the range 20 to 200 nm, preferably 50 to 200 nm. The etched particles are cleaned and placed in an ultra sound bath for between 30 and 90 seconds to give silicon containing porous particle fragments having a diameter in the range 5 to 25 µm.

In a second preferred embodiment of the second aspect of the invention, a method comprises preparing a silicon-containing porous particle having a diameter of at least 60 µm, preferably at least 100 µm and especially at least 120 µm and having an average smallest dimension (thickness) in the range 50 nm to 2 µm, preferably 100 nm to 1 µm are partially crushed to give porous particle fragments having an overall diameter in the range 1 to 40 µm, preferably 1 to 20 µm, more preferably 1 to 15 µm and especially 1 to 10 µm and an average smallest dimension (or thickness) of the fragment's microstructure in the range 50 nm to 2 µm, preferably 100 nm to 1 µm. A further preferred embodiment of the second aspect of the invention comprises partially crushing a silicon-containing porous particle having a diameter in the range 60 to 1500 µm, preferably 100 to 1000 µm to give porous particle fragments having a diameter and average smallest dimension as specified herein above.

As indicated above, the porous particle fragments of the first aspect of the invention are prepared by partially crushing a porous particle fragment, which is preferably prepared, for example, by etching a silicon aluminium alloy particle. The structure of the porous particle fragment depends on the composition of the alloy particle from which the porous particles are derived and the techniques used to fabricate the alloy particles. In a third particularly preferred embodiment of the second aspect of the invention there is provided a method of preparing porous particle fragments according to the second aspect of the invention, the method comprising the steps:

a) Providing a molten silicon aluminium alloy composition comprising between 12 and 30 wt % silicon;
 b) Cooling the molten silicon aluminium alloy composition at between $10^2$ and $10^5$ K/s to form a silicon aluminium particulate material having a diameter in the range 40 to 1500 µm;
 c) Etching the particulate material formed in (b) to form porous particles
 d) Partially crushing the porous particles formed in (c) to give porous particle fragments having a maximum diameter of less than 40 µm The molten alloy is suitably cooled in step (b) using either gas atomisation or melt spinning techniques. The etchants used in step (c) are well known to a person skilled in the art and are listed herein above. Where the alloy is a silicon aluminium alloy the amount of aluminium that can be removed from the alloy will depend on the etching conditions used.

The invention also provides silicon containing porous particle fragments prepared according to the method of the second aspect of the invention. A third aspect of the invention provides a composition comprising a plurality of silicon containing porous particle fragments prepared by partially crushing a plurality of silicon containing porous particles. The silicon containing porous particles from which the silicon containing porous particle fragments are derived suitably have a diameter of greater than 40 µm, preferably greater than 60 µm, more preferably greater than 100 µm and especially greater than 120 µm. Typically the silicon containing porous particles from which the silicon containing porous particle fragments are derived suitably have a diameter in the range 40 to 200 µm, preferably 50 to 150 µm and especially 70 to 100 µm. Preferably the porous particle fragments of the first aspect of the invention are prepared from porous particles (including porous particles comprising a network of elongate elements) having a diameter in the range 60 to 1500 µm, more preferably 150 to 1000 µm. These "starting particles" may be prepared by either etching a silicon aluminium alloy or by stain etching of a silicon particle using methods that are known to a skilled person as set out above.

In a first particularly preferred embodiment of the third aspect of the invention there is provided a composition comprising a plurality of silicon-containing porous particle fragments having a diameter in the range 1 to 40 µm, preferably 1 to 20 µm, more preferably 1 to 15 µm and especially 1 to 10 µm and an average smallest dimension (thickness) in the range 50 nm to 2 µm, preferably 100 nm to 1 µm, the porous particles being prepared by partially crushing porous silicon-containing particles having a diameter of at least 60 µm, preferably at least 100 µm and especially at least 120 µm and having an average smallest dimension in the range 50 nm to 2 µm, preferably 100 nm to 1 µm. The silicon-containing whole porous particles are suitably prepared by etching a silicon alloy, preferably a silicon/aluminium alloy in a solution comprising a mixture of acetic acid, nitric acid and phosphoric acid to remove the bulk metal with which the silicon material is alloyed, washing and drying the particle.

A second preferred embodiment of the third aspect of the invention provides a porous particle fragment prepared by a method comprising the steps of:

a) Providing a molten silicon aluminium alloy composition comprising between 12 and 30 wt % silicon;
 b) Cooling the molten silicon aluminium alloy composition at between $10^2$ and $10^5$ K/s to form a silicon aluminium particulate material having a diameter in the range 40 to 1500 µm;
 c) Etching the particulate material formed in (b) to form porous particles
 d) partially crushing the porous particles formed in (c) to give porous particle fragments having a maximum diameter of less than 40 µm The molten alloy is suitably cooled in step (b) using either gas atomisation or melt spinning techniques. The etchants used in step (c) are well known to a person skilled in the art and are listed herein above. Where the alloy is a silicon aluminium alloy the amount of aluminium that can be removed from the alloy will depend on the etching conditions used.

The porous particle fragments according to the third aspect of the invention can be characterised by fractal or pore wall thicknesses in the range 50 nm to 2 µm. Porous particle fragments having a fractal thickness of 50 to 100 nm can be used to make batteries. Fractal structures having a fractal or pore wall thickness in the range 100 nm to 200 nm can be used to prepare composite electrodes, which exhibit particularly good cycling behaviour.

5. ELECTRODES

The electroactive material according to the first aspect of the invention can be used in the manufacture of an electrode. The electrode is typically an anode. The electrodes are preferably used in the manufacture of a lithium secondary battery. A fourth aspect of the invention therefore provides an electrode comprising a composition according to the first aspect of the invention and a current collector. Preferably an electrode according to the fourth aspect of the invention comprises a composition according to the first aspect of the invention, a binder and a current collector. The electroactive material according to the first aspect of the invention is suitably provided in the form of an electrode or anode material, said electrode or anode material comprising in addition to the silicon containing porous particle fragments, a binder and optionally one or more components selected from the group comprising, a conductive material and a further electroactive material. Preferably the electrode or anode material comprises fractals as described above. The anode material can be in the form of a free-standing mat which can be connected or adhered to a current collector. Alternatively the anode mix can be provided in the form of a coating, which can be adhered to a current collector. The components of the anode mix from which the mat is formed are typically randomly arranged within the anode structure to provide optimum connectivity between the elements. The electrodes of the fourth aspect of the invention are easily prepared and a fifth aspect of the invention provides a method for fabricating an electrode comprising the steps of forming an electrode or anode mix, said electrode or anode mix comprising a slurry of a composition according to the first aspect of the invention and a solvent (herein after referred to as an electrode mix) and casting the electrode or anode mix onto a substrate and drying the product to remove the solvent thereby to form the electrode or anode material on the substrate. The dried product (electrode material) is in the form of a cohesive mass which may be removed from the substrate, connected to a current collector and used as an electrode. Alternatively, where the composition according to the first aspect of the invention is adhered to the substrate as a result of casting and drying the slurry (electrode mix), the resulting cohesive mass will be connected or bonded to a current collector. In a preferred embodiment of the first aspect of the invention the composition is cast onto a substrate, which is itself a current collector. One or more components selected from the group comprising a conductive material, a viscosity adjuster, a filler, a cross-linking accelerator, a coupling agent and an adhesive accelerator may also be included in the slurry mixture (electrode mix). Examples of suitable conductive materials, viscosity adjusters, fillers, cross-linking accelerators, coupling agents and adhesive accelerators are provided above. Suitable solvents include N-methylpyrrolidone and water.

Suitable current collectors for use in electrodes according to the fourth aspect of the invention include copper foil, aluminium, carbon (including graphite), conducting polymers and any other conductive materials. The current collectors typically have a thickness in the range 10 to 50 µm, preferably 10 to 20 µm. Current collectors can be coated with the electrode mix on one side or can be coated with the electrode mix on both sides. In a preferred embodiment of the fifth aspect of the invention a composition of the first aspect of the invention is preferably applied to one or both surfaces of the current collector to a thickness of between 1 mg/cm$^2$ and 6 mg/cm$^2$, preferably between 1 mg/cm$^2$ and 3 mg/cm$^2$ per surface such that the total thickness of the electrode (current collector and coating) is in the range 25 um to 1 mm where only one surface of the current collector is coated or in the range 50 µm to 1 mm where both surfaces of the current collector are coated. In a preferred embodiment, the electrode or anode material is applied to a thickness of between 30 and 40 µm onto one or both surfaces of a copper substrate having a thickness of between 10 and 15 µm. The current collector may be in the form of a continuous sheet or a porous matrix or it may be in the form of a patterned grid or mesh defining metallised regions and non-metallised regions. Where the current collector comprises a continuous sheet, the electrode may be readily manufactured by applying a slurry of the anode mix directly to the current collector. Where the current collector comprises a metallised grid, this metallised grid may be formed onto a non-stick substrate such as PTFE to give a metallised non-stick surface (such as metallised PTFE) and the slurry of the anode mix is applied to the metallised non-stick surface and dried to give a metallised mat or felt. Alternatively the mesh or grid can be dipped into a solution or slurry to form a composite electrode.

In one embodiment of the fifth aspect of the invention, the electrode may be formed by casting the silicon containing mixture onto a substrate thereby to form a self supporting structure and connecting a current collector directly thereto.

The electrode of the fourth aspect of the invention can be used as an anode in the manufacture or formation of a lithium secondary battery. A sixth aspect of the invention provides a secondary battery comprising a cathode, an anode comprising a composition according to the first aspect of the invention and an electrolyte.

6. CATHODE

The cathode is typically prepared by applying a mixture of a cathode active material, a conductive material and a binder to a cathode current collector and drying. Examples of cathode active materials that can be used together with the anode active materials of the present invention include, but are not limited to, layered compounds such as lithium cobalt oxide, lithium nickel oxide or compounds substituted with one or more transition metals such as lithium manganese oxides, lithium copper oxides and lithium vanadium oxides. Many such materials can be defined by the generic formula $Li_{1+x}(Ni_bCo_cAl_eMn_f)_{1-x}O_2$, where b, c, e, f and x have values of between 0 and 1. Examples of suitable cathode materials include $LiCoO_2$, $LiCo_{0.99}Al_{0.01}O_2$, $LiNiO_2$, $LiMnO_2$, $LiMn_2O_4$, $LiCO_{0.5}Ni_{0.5}O_2$, $LiCo_{0.7}Ni_{0.3}O_2$, $LiCo_{0.8}Ni_{0.2}O_2$, $LiCo_{0.82}Ni_{0.18}O_2$, $LiCo_{0.8}Ni_{0.15}Al_{0.05}O_2$, $LiNi_{0.4}CO_{0.3}Mn_{0.3}O_2$, $Li_{1+x}(Ni_{0.333}CO_{0.333}Mn_{0.333})_{1-x}O_2$, $Li_{1+x}(Ni_{0.5}CO_{0.2}Mn_{0.3})_{1-x}O_2$, $Li_{1+x}(Ni_{0.4}CO_{0.2}Mn_{0.4})_{1-x}O_2$, and $Li_{1+x}Ni_{0.8}CO_{0.15}Al_{0.05}O_2$, phosphate-based cathodes such as $LiFePO_4$, non-lithiated cathode materials like $V_6O_{13}$, and sulphur/polysulphide cathodes. The cathode current collector is generally of a thickness of between 3 to 500 µm. Examples of materials that can be used as the cathode current collector include aluminium, stainless steel, nickel, titanium and sintered carbon.

7. ELECTROLYTE

The electrolyte is suitably a non-aqueous electrolyte containing a lithium salt and may include, without limitation, non-aqueous electrolytic solutions, solid electrolytes and inorganic solid electrolytes. Examples of non-aqueous electrolyte solutions that can be used include non-protic organic solvents such as N-methylpyrrolidone, propylene carbonate, ethylene carbonate, butylenes carbonate, dimethyl carbonate, diethyl carbonate, gamma butyrolactone, 1,2-dimethoxy ethane, 2-methyl tetrahydrofuran, dimethylsulphoxide, 1,3-dioxolane, formamide, dimethylformamide, acetonitrile, nitromethane, methylformate, methyl acetate, phosphoric acid trimester, trimethoxy methane, sulpholane, methyl sulpholane and 1,3-dimethyl-2-imidazolidione.

Electrolyte solutions comprising a mixture of cyclic and acyclic carbonate species are preferred. Examples of cyclic carbonates that can be used as base solvents include, but are not limited to, ethylene carbonate (EC), diethylene carbonate (DEC), propylene carbonate (PC) and butylene carbonate, fluoroethylene carbonate (FEC), difluoroethylene carbonate (DFEC), γ-butyrolactone and γ-valerolactone. Examples of chain or linear carbonates that can be used as base solvents include, but are not limited to, dimethylcarbonate (DMC), diethylcarbonate (DEC), ethyl methyl carbonate (EMC), methyl propyl carbonate, dibutyl carbonate (DBC) and methyl octyl carbonate (MOC). Examples of halogenated cyclic carbonates that can be used as electrolyte solvents include but are not limited to 4-fluoro-1,3-dioxolane-2-one, 4-chloro-1,3-dioxolane-2-one, 4,5-difluoro-1,3-dioxolane-2-one, tetrafluoro 1,3-dioxolane-2-one, 4-fluoro-5-chloro-1,3-dioxolane-2-one, 4,5-dichloro-1,3-dioxolane-2-one, tetrachloro-1,3-dioxolane-2-one, 4,5- bistrifluoromethyl-1,3-dioxolane-2-one, 4-trifluoromethyl-1,3-dioxolane-2-one, 4,5-difluoro 4,5-dimethyl-1,3-dioxolane-2-one, 4-methyl-5,5-difluoro-1,3-dioxolane-2-one, 4-ethyl-5,5-difluoro-1,3-dioxolane-2-one, 4-trifluoromethyl-5-fluoro-1,3-dioxolane-2-one, 4-trifluoromethyl-5-methyl-1,3-dioxolane-2-one, 4-fluoro-4,5-dimethyl-1,3-dioxolane-2-one, 4,4-difluoro 5-(1,1-difluoro ethyl)-1,3-dioxolane-2-one, 4,5-dichloro-4,5-dimethyl-1,3-dioxolane-2-one, 4-ethyl-5-fluoro-1,3-dioxolane-2-one, 4-ethyl-4,5-difluoro 1,3-dioxolane-2-one, 4-ethyl-4,5,5-trifluoro-1,3-dioxolane-2-one, 4-fluoro-4-trifluoromethyl-1,3-dioxolane-2-one. Fluorinated cyclic carbonates are preferred. Preferably the base cyclic carbonate is ethylene carbonate (EC) or fluoroethylene carbonate (FEC). Preferably the chain (or linear) carbonate is ethyl methyl carbonate or diethyl carbonate. In a particularly preferred third embodiment the base solvent comprises a mixture of fluoroethylene carbonate (FEC) and ethyl methyl carbonate (EMC). Electrolyte compositions suitably comprise a mixture of a cyclic carbonate and a chain or linear carbonate in a ratio of between 30:70 to 70:30, preferably between 30:70 and 1:1.

It is further preferred that the electrolyte solutions comprise a cyclic carbonate including a vinyl group, examples of which include vinylene carbonate, methyl vinylene carbonate, ethyl vinylene carbonate, propyl vinylene carbonate, phenyl vinylene carbonate, dimethyl vinylene carbonate, diethyl vinylene carbonate, dipropyl vinylene carbonate, diphenyl vinylene carbonate, vinyl ethylene carbonate and 4,5-divinyl ethylene carbonate. Vinyl ethylene carbonate, divinyl ethylene carbonate and vinylene carbonate are preferred. In general the cyclic carbonate including a vinyl group will suitably comprise at least 1%, 2%, 3%, 5%, 10% or 15% by weight of the electrolyte solution. The concentration of the halogenated cyclic carbonate will, in general, not exceed 70 wt % of the electrolyte solution.

In a particularly preferred embodiment of the sixth aspect of the invention there is provided a battery comprising a cathode, an anode comprising a composition according to the first aspect of the invention and an electrolyte including an electrolyte solvent and an electrolyte salt, wherein the electrolyte solvent comprises a mixture of fluoroethylene carbonate (FEC) and ethylmethyl carbonate (EMC). It is particularly preferred that the electrolyte solvent includes a cyclic carbonate including a vinyl carbonate as an additive. In a most preferred embodiment of the sixth aspect of the invention the electrolyte solvent comprises 40 to 60 vol %, preferably 50 vol % FEC, 40 to 48 vol %, preferably 46 vol % EMC and 2 to 10 vol %, preferably 4 vol % VC.

Examples of organic solid electrolytes include polyethylene derivatives polyethyleneoxide derivatives, polypropylene oxide derivatives, phosphoric acid ester polymers, polyester sulphide, polyvinyl alcohols, polyvinylidine fluoride and polymers containing ionic dissociation groups.

Examples of inorganic solid electrolytes include nitrides, halides and sulphides of lithium salts such as $Li_5NI_2$, $Li_3N$, LiI, $LiSiO_4$, $Li_4SiS_3$, $Li_4SiO_4$, LiOH and $Li_3PO_4$.

The lithium salt is suitably soluble in the chosen solvent or mixture of solvents. Examples of suitable lithium salts include LiCl, LiBr, LiI, $LiClO_4$, $LiBF_4$, $LiB_{10}C_{20}$, $LiPF_6$, $LiCF_3SO_3$, $LiAsF_6$, $LiSbF_6$, $LiAlCl_4$, $CH_3SO_3Li$ and $CF_3SO_3Li$, lithium bis(oxatlato)borate (LiBOB) or a mixture thereof, dissolved in one or more cyclic and dialkyl carbonates referred to above. Examples of other electrolyte salts that can be used are found in JP 2008234988, U.S. Pat. No. 7,659,034, US 2007/0037063, U.S. Pat. No. 7,862,933, US 2010/0124707, US 2006/0003226, U.S. Pat. No. 7,476,469, US 2009/0053589 and US 2009/0053589. Preferably the electrolyte salt is $LiPF_6$ or a mixture of $LiPF_6$ and lithium bisoxalate borate (LiBOB). A preferred electrolyte solution comprises 0.9 to 0.95M $LiPF_6$ and 0.05 to 0.1M LiBOB. The concentration of the lithium salt in the electrolyte solution is not limited but is preferably in the range of 0.5 to 1.5M. When larger amounts of additives are used it is preferable to increase the concentration of the lithium salt to prevent excessive depletion of lithium in the final electrolyte solution.

Where the electrolyte is a non-aqueous organic solution, the battery is provided with a separator interposed between the anode and the cathode. The separator is typically formed of an insulating material having high ion permeability and high mechanical strength. The separator typically has a pore diameter of 0.01 to 100 μm and a thickness of 5 to 300 μm.

The battery according to the sixth aspect of the invention can be used to drive a device, which relies on battery power for its operation. Such devices include mobile phones, laptop computers, GPS devices, motor vehicles and the like. A seventh aspect of the invention therefore includes a device including a battery according to the sixth aspect of the invention.

The invention will now be described with reference to the following figures and non-limiting examples. Variations on these falling within the scope of the invention will be evident to a person skilled in the art.

8. FIGURES

FIG. 1 shows a schematic view of a prior art battery.

FIG. 2a shows an SEM image of a porous particle produced according to the procedure set out in the examples below. These porous particles were prepared by etching particles of an AlSi alloy comprising 12 wt % silicon and having a diameter of 10 to 63 μm, the alloy particles being formed through the use of a gas atomisation cooling technique. The silicon structures are characterised by a network of fine silicon structures.

FIG. 2b shows a schematic diagram of the fine silicon fractal structures formed by partially crushing a porous particle illustrated in 2a.

FIG. 2c shows an SEM of the silicon structures formed by partially crushing a porous particle illustrated in 2a.

Figure 1:
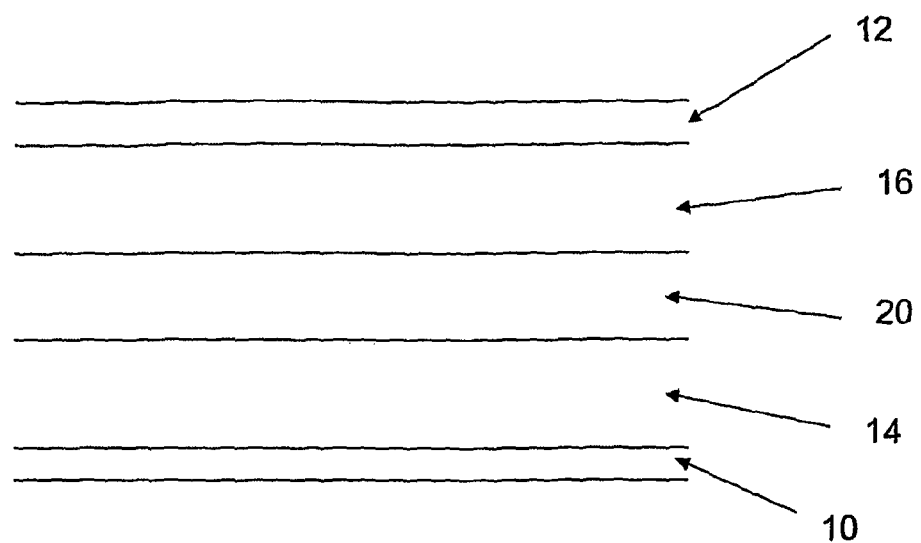
Figure 2A:
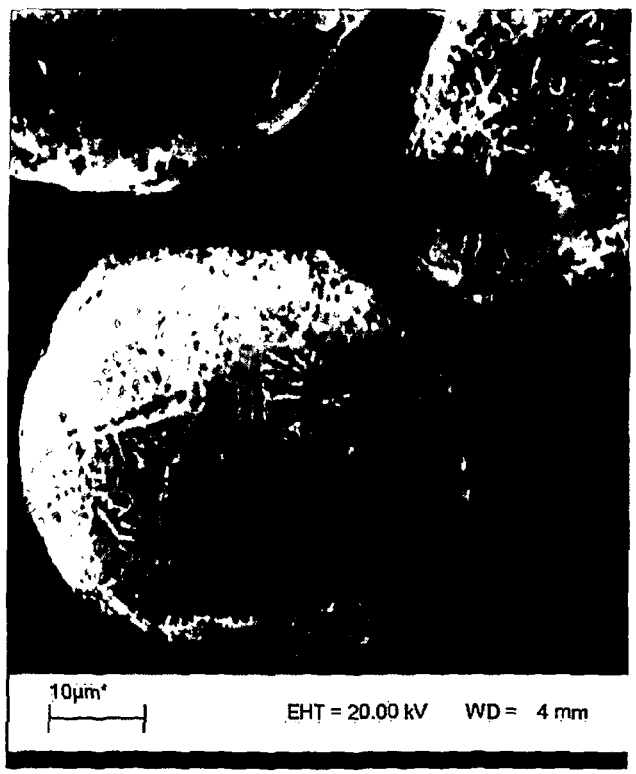
Figure 2B:
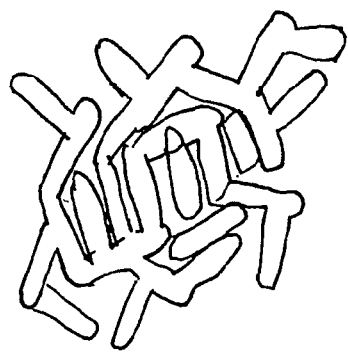
Figure 2C:
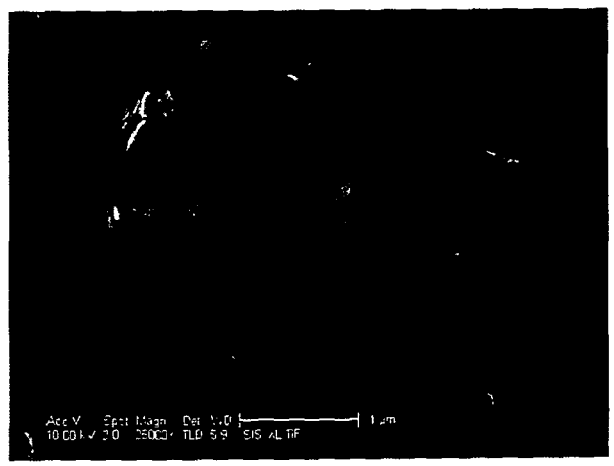
Figure 2D:

FIG. 2d shows an SEM image of a porous particle produced according to the procedure set out in the examples below. These porous particles were prepared from particles of an AlSi alloy comprising 27 wt % silicon and having a diameter of 10 to 90 μm, the alloy particles being formed through the use of a gas atomisation cooling technique. The porous particle is characterised by regions of particulate silicon interspersed within regions of finely branched silicon fibres.

Figure 2E:
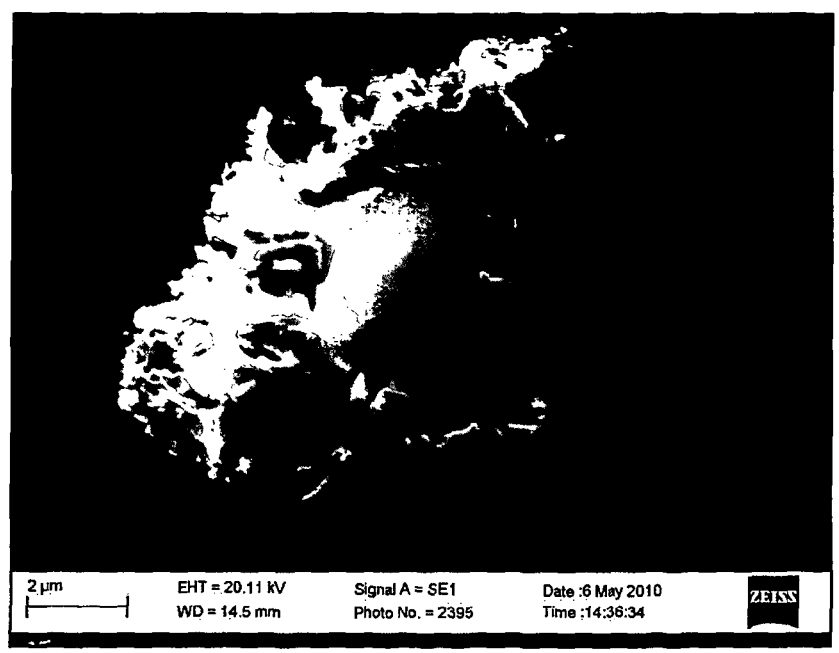

FIG. 2e shows an SEM image of a porous particle fragment obtained by partially crushing porous particles illustrated in FIG. 2d.

Figure 2F:
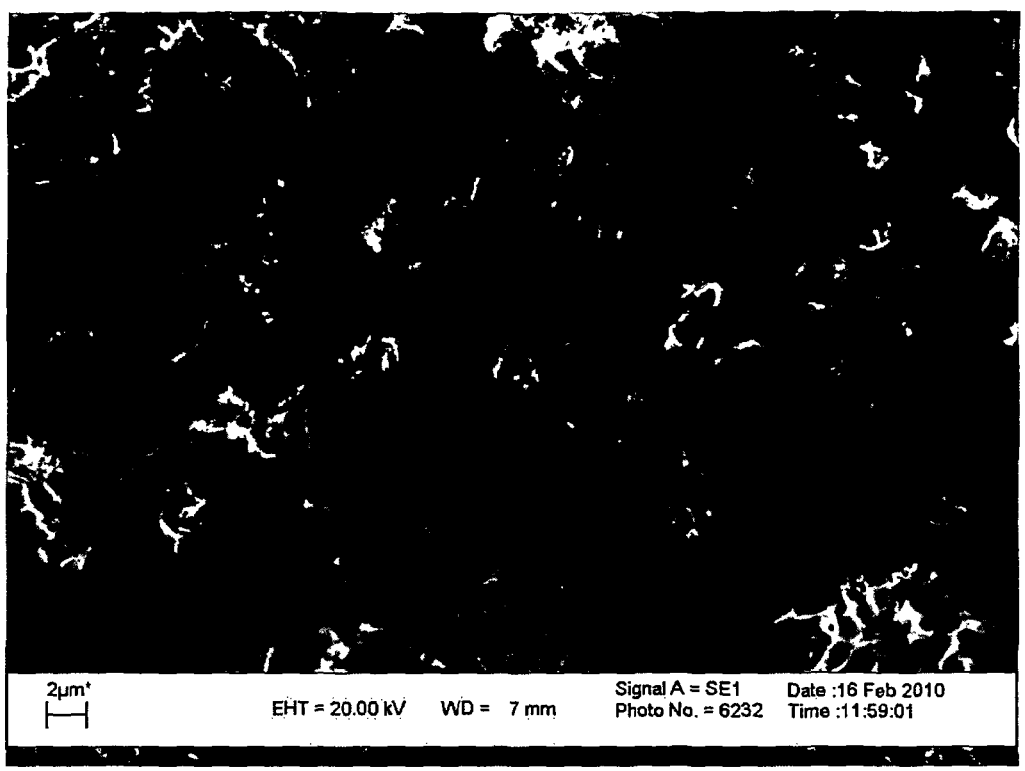

FIG. 2f shows an SEM of a porous particle fragment (fractal) produced by partially crushing the porous particles produced from AlSi(12 wt %) alloy particles (formed using a gas atomisation technique) and having a diameter of 60 to 90 μm, the porous particles being produced according to the procedure set out in the examples below.

Figure 3A:
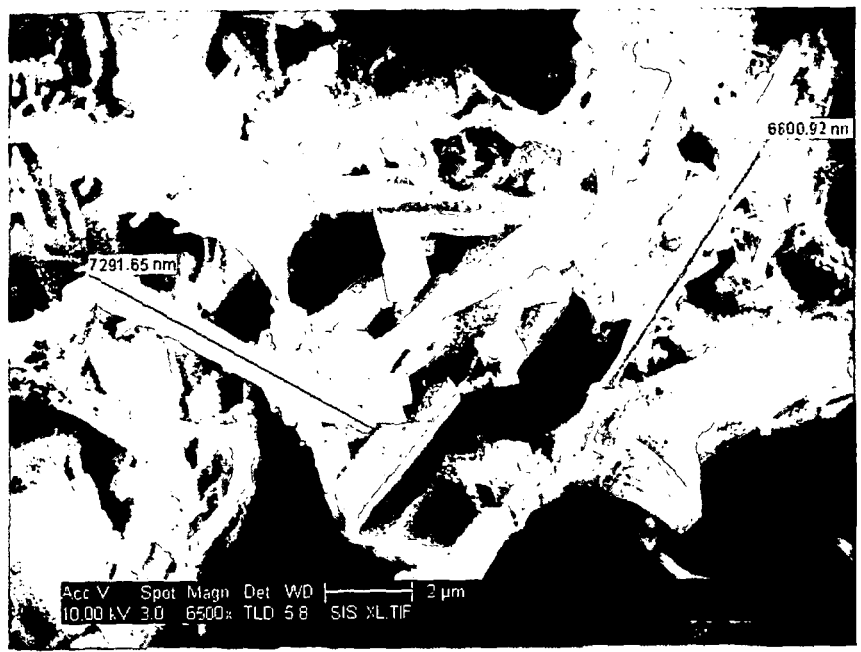

FIG. 3a shows an SEM image of a porous particle fragment produced according to the procedure set out in the examples below. These porous particle fragments were prepared by partially crushing porous particles obtained by etching the larger particles of an AlSi alloy comprising 12 wt % silicon and having a diameter in the range 90 to 1000 μm, the alloy particles being the larger size fraction obtained using a gas atomisation technique. Melt spinning appears to yield similar results. Note the relatively coarser nature of the silicon structures compared to the structures illustrated in FIGS. 2a, 2b and 2e.

Figure 3B:
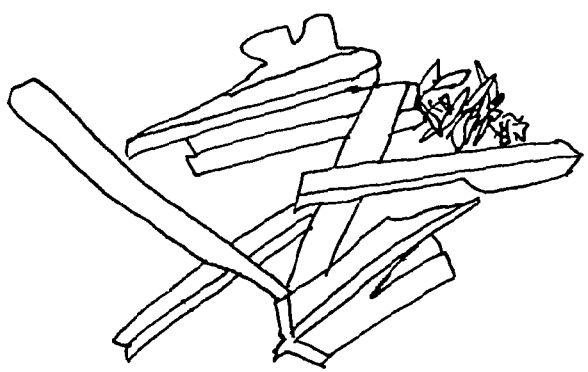

FIG. 3b shows a schematic diagram of the silicon structures formed in the AlSi(12 wt %) alloy particle, which was used to form the porous particle fragments in FIG. 3b above (these structures also being present in the corresponding porous particle) using the gas atomisation technique. Melt spinning appears to yield similar results.

Figure 3C:
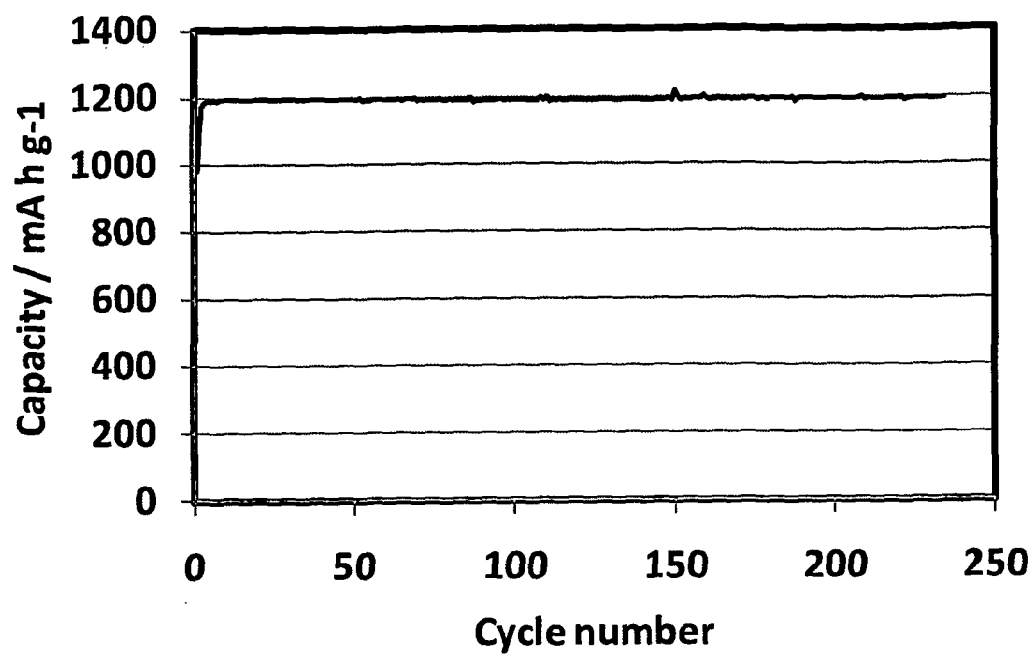
Figure 3D:
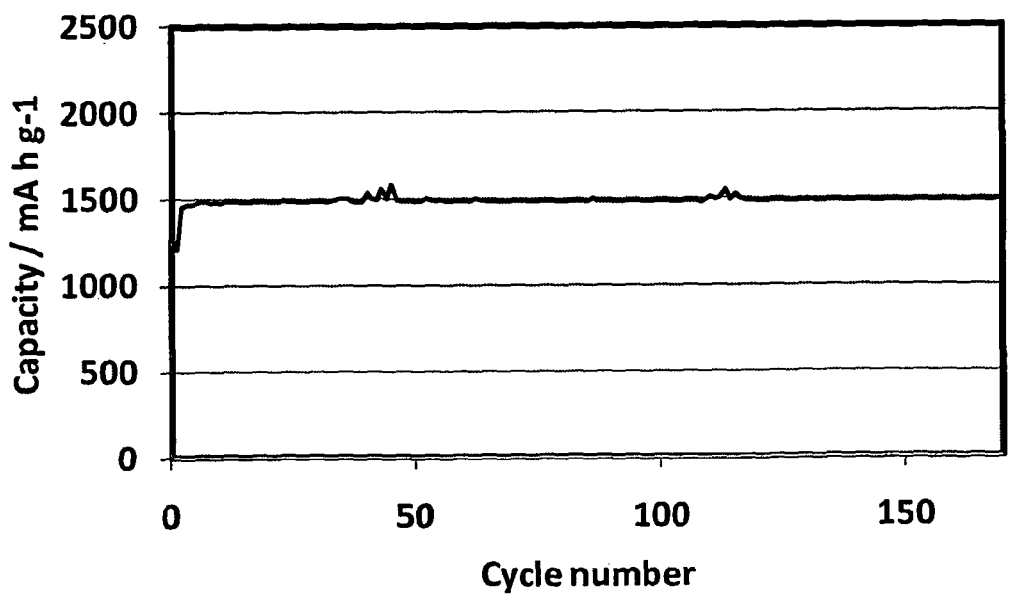
Figure 4:
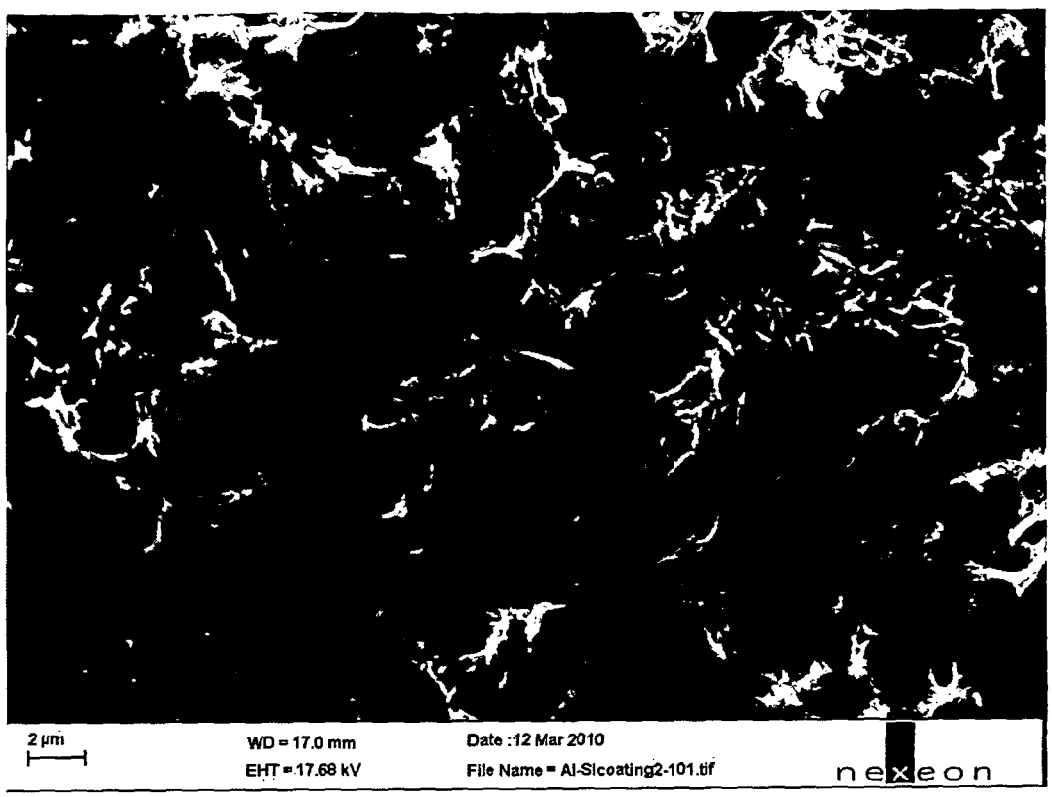

FIG. 3c is a plot of discharge capacity vs the number of cycles for a battery cell produced using the material of 3a and 3b and cycled at a constant capacity of 1200 mAh/g FIG. 3d is a plot of discharge capacity vs the number of cycles for a half cell produced using the material of 3a and 3b and cycled at a constant capacity of 1500 mAh/g FIG. 4 shows an SEM image of an electrode composite mix comprising porous particle fragments produced according to the procedure set out in the examples below. These porous particle fragments were prepared by partially crushing porous particles obtained by etching 60-90 μm particles of an AlSi alloy comprising 12 wt % silicon, alloy particles being obtained using a gas atomisation technique.

Figure 5:
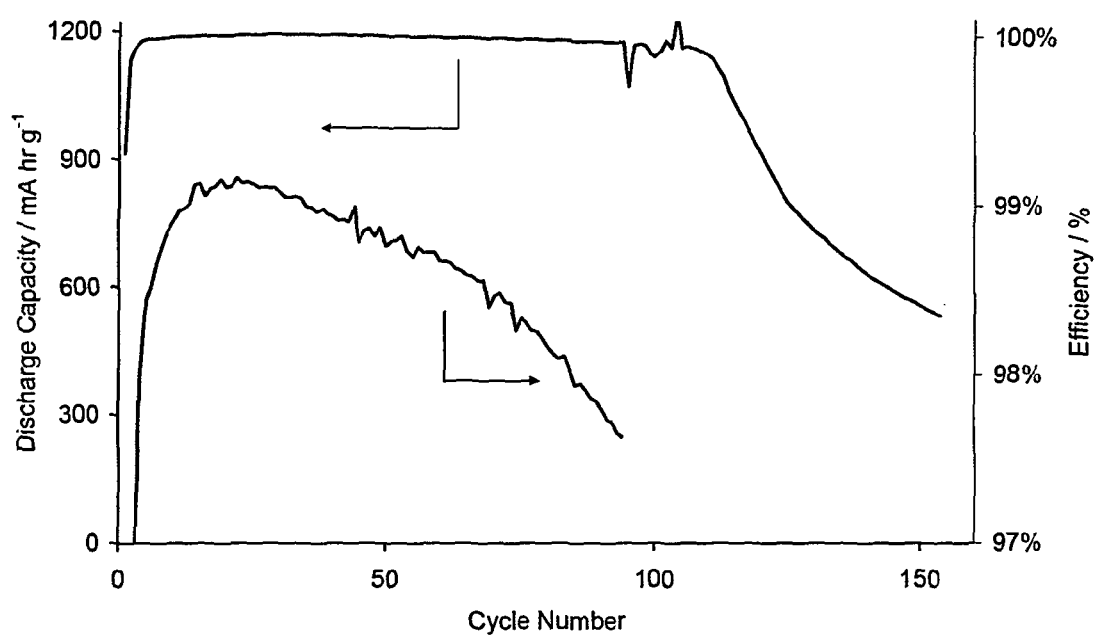

FIG. 5 shows a plot of discharge capacity and coulombic efficiency vs the number of cycles for a battery cell produced and tested according the procedure set out in the examples below, produced using the electrode of FIG. 4 and cycled at a constant capacity of 1200 mAh/g.

Figure 6A:
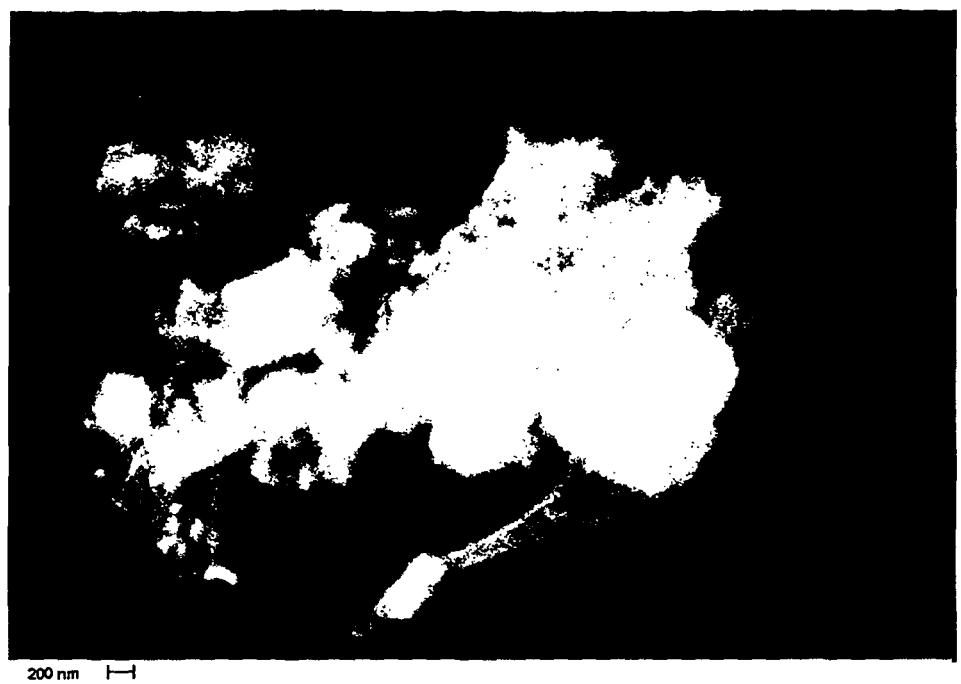

FIG. 6a shows an SEM of the coarse silicon porous particle fragment comprising silicon particulates as well as rod like and fibrous structures, formed by partially crushing a porous particle obtained by etching particles of an AlSi alloy comprising 30 wt % silicon, the alloy particles being of size 90-150 μm and obtained using a gas atomisation technique.

Figure 6B:
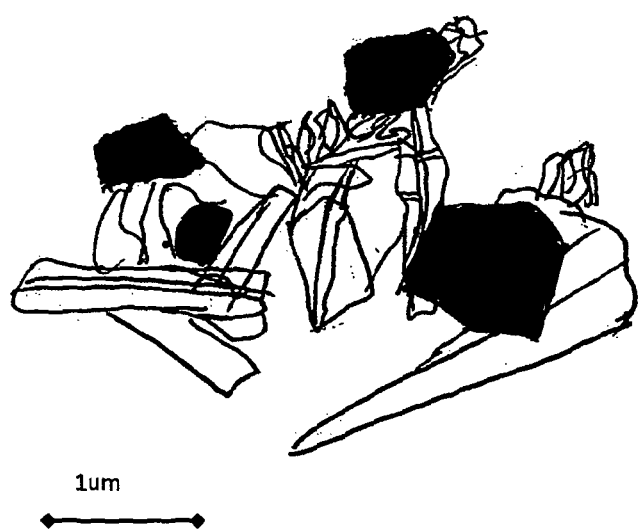

FIG. 6b shows a schematic diagram of the structures in 6a.

Figure 7A:
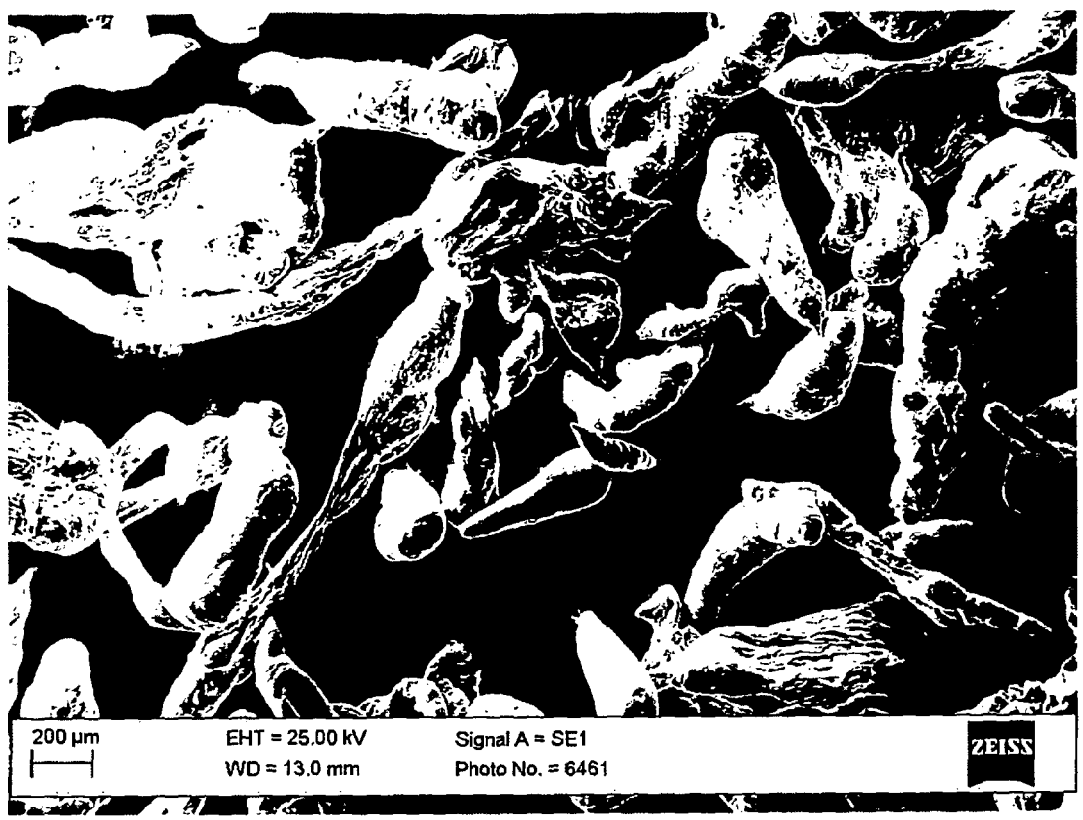

FIG. 7a shows an SEM image of an unetched silicon aluminium alloy particles containing 12 wt % silicon produced using the melt spinning technique.

Figure 7B:

FIG. 7b shows an SEM image of a fragment produced by partially crushing a porous particle fabricated by etching a melt spun alloy particle illustrated in FIG. 7a. The fragment comprises a mixture of fine and coarse elongate elements formed into branched dendritic or tree-like structures.

EXAMPLES

Example 1a—Preparation of Electrode Materials

General steps outlining the etching an aluminium silicon alloy to obtain silicon structures:
1. Particles of an Al—Si alloy comprising 12%, 27% and 30% silicon were obtained from a foundry or obtained using the methods set out in; O. Uzun et al. Production and Structure of Rapidly Solidified Al—Si Alloys, Turk J. Phys 25 (2001), 455-466; S. P. Nakanorov et al. Structural and mechanical properties of Al—Si alloys obtained by fast cooling of a levitated melt. Mat. Sci and Eng A 390 (2005) 63-69). The making of such alloys is commonly applied in industry for making the 4XXX group of aluminium casting alloys (see http://www.msm.cam.a-c.uk/phase-trans/abstracts/M7-8.html. An example would be a commercially available Al—Si 12% alloy as cast that is cooled at a rate of approx 100° $Ks^{-1}$ and that is subjected to no further post-solidification heat treatment.
2. The aluminium matrix was etched away using a mixed acid reagent, which is commonly practised in industrial processes. Keller's reagent (2 ml HF, 3 ml HCl, 5 ml HNO3, 190 ml water) can be used as an acid etchant. The silicon structures were separated from the liquor using centrifuging and/or filtration. The product was rinsed with deionised water 1-5 times until etchants were removed by suspending the structures in the aqueous solution.
3. The structures were isolated from the rinsing water by filtering and/or centrifuging to the required maximum moisture level, which may involve a drying step.
4. Isolated structures having diameters falling within a predetermined size range were partially crushed as follows: the structures were dispersed in deionised water and placed in the reservoir of a sonic bath. The sample was ground with a pestle and mortar for 15 minutes and then sonicated for 5 minutes at 27 KHz to give samples having a diameter of between 2 and 5 μm. Alternatively the sample was sonicated at 27 KHz for between 5 and 50 Minutes, preferably 10 to 20 minutes to give silicon containing porous particle fragments having a maximum diameter in the range 1 to 5 μm.

Small amounts (less than 30 grams) of etched silicon particles may also be broken up by grinding in a mortar and pestle. Larger amounts can be ball milled Example 1b Preparation of a porous particle fragment silicon electrode material using a Si/Al alloy. The steps outlined in the general method defined in Example 1a above were followed. Specifically:
1. An Al—Si matrix material comprising particles of Argon or Nitrogen-fired 12 wt % Si—Al alloy having an initial particle size in the range 12-63 μm was used as a starting material. A typical chemical analysis of this material shows 11.7% Si+3.49% Bi, 0.45% Fe, 0.28% Mn.
2. The starting material was etched using an etch solution having a composition by reactants of: 5 ml concentrated 70% Nitric Acid (15.8M); 3 ml concentrated 36% hydrochloric acid (11.65M); 2 ml 40% hydrofluoric acid; and 100 ml water. The molar composition of the etch solution was therefore: 0.72M nitric acid; 0.32M hydrochloric acid; and 0.41M hydrofluoric acid.
3. 1.4 grams of Al—Si alloy per 100 ml etchant was added to the etchant in an HDPE container with a magnetic follower and stirrer at room temperature for 1-2 hours on a slow setting. The stirrer was turned off and the reaction continued over 16 hours to completion. The silicon particles settled at bottom of reaction vessel.
4. The spent etch was poured off and the silicon particles were rinsed with deionised water until they are pH 5/7. Because the particles tended to separate under the influence of gravity between rinses, a centrifuge was used to speed up the process. FIG. 2a shows an example of the porous particles so produced.
5. The isolated particles were further dispersed in water (5 ml) in a beaker and were subjected to ultra sonic agitation at 27 KHz for 5 minutes to partially crush the silicon containing porous particles to give particle fragments having a diameter of from 1 to 2 μm. Alternatively, the silicon containing porous particles could be added to a small amount of water and crushed using a pestle and mortar for 5 minutes or a ball bill as specified herein above. FIG. 2c illustrates the nature of porous particle fragments created from subjecting porous particles to 5 minutes ultra-sonication.

Example 1c

The methods of Examples 1a and 1b were followed, but were modified in that (a) the composition of the etch solution (step 2) was: 5% concentrated nitric acid; 80% concentrated phosphoric acid; and 5% glacial acetic acid; and (b) the loading level (step 3) is 50 ml etchant to 1 gram alloy. During etching the reaction temperature was observed to rise by between 10-15° C. Most of the reaction is completed in 1-2 hours and the temperature falls back to room temperature.

Etching can be performed more vigorously by adding less water. This causes a considerable increase in the etchant temperature. For example, a two-fold increase in concentration leads to a temperature of 50-60° C.

EDX (energy-dispersive X-ray spectroscopy) analysis of a batch of 12% Si particles showed that there was less than 1% Al retained in the bulk silicon. There may be traces of Al left in the very small pearls of Silicon. Aluminium is a good high capacity anode element in its own right and aids electrical connectivity. It may therefore be preferable that some Al is retained in the Si particles, or even connects one or more Si particles together

Example 1d

The method of example 1b was followed except that the starting material was an Al—Si alloy material comprising particles of Argon or Nitrogen-fired 30 wt % Si—Al alloy having an initial particle size in the range 10-90 µm. FIG. 2d shows an example of porous particles made by this method.

Example 1e

The method of example 1b was followed except that the starting material was an Al—Si alloy material comprising particles of Argon or Nitrogen-fired 12 wt % Si—Al alloy having an initial particle size in the range 60-90 µm. FIG. 2f shows porous particle fragments produced using this method.

Example 1f

The method of example 1b was followed except that the starting material was an Al—Si alloy material comprising particles of Argon or Nitrogen-fired 12 wt % Si—Al alloy having an initial particle size in the range 90-150 µm. FIGS. 3a and 3b show porous particle fragments produced using this method.

Example 1g

The method of example 1b was followed except that the starting material was an Al—Si alloy material comprising particles of Argon or Nitrogen-fired 30 wt % Si—Al alloy having an initial particle size in the range 90-150 µm.

Example 1h

The method of any one of examples 1a to 1c were followed except that the cleaned and etched porous particles were formed into a slurry with the binder and optionally graphite and/or a conductive carbon and treated to partially crush the porous particles to give a slurry (optionally an electrode mix) comprising porous particle fragments.

Example 2—Characterisation of Silicon Containing Porous Particle Fragments

2a—Porous Particle Fragments Made Using Method 1b and 1d

The silicon containing porous particles used as the starting material for preparing the silicon containing porous particle fragments as well as the silicon containing porous particle fragments themselves were characterised using scanning electron microscopy (SEM). FIGS. 2a and 2c are SEM images of a silicon containing porous particle and a porous particle fragment of the present invention prepared from the porous particle using the method described in Example 1b (prepared from 10-63 µm AlSi alloy particles with 12 wt % silicon). FIG. 2b is a schematic representation of the structures observed in FIG. 2c. The structures illustrated in FIGS. 2a to 2c are characterised by very fine rod like branches or fibrils of Si approx 50-100 nm diameter in fractal patterns throughout the particles. Branching of these fibrils is approx every 200 nm. The cooling rate was estimated to be approx 10^4 K/s. The BET value of the porous particle fragments produced from these materials (FIG. 2c) was 70 m$^2$/g.

The structures illustrated in FIGS. 2d and 2e prepared from 10-90 µm AlSi alloy particles with 27 wt % silicon are also characterised by very fine rod like branches. However, distinct islands of silicon are distributed amongst these rod like branches, reflecting the hypereutectic nature of the alloy used to prepare the porous particles.

2b—Porous Particle Fragments Made Using Method 1e

FIG. 2f is an SEM image of porous particle fragments of the present invention produced using method 1e from AlSi alloy particles of size 60-90 µm and 12 wt % silicon. The structures are a bit more coarse compared to the fragments produced by method 1b though still quite fine. The BET value of these fragments was found to be 40 m$^2$/g. This material was also characterised using XRD as described herein and the 111 lattice spacing was measured as 3.15589 Angstroms and the crystallite size was calculated to be 51 nm.

2c—Porous Particle Fragments Made Using Methods 1f and 1g

FIG. 3a is an SEM image of the porous particle fragments of the present invention produced using method 1f (from alloy particles of size 90-150 µm and 12 wt % silicon). FIG. 3b is a schematic representation of the structures observed in 3a. It can be seen that the larger alloy particle size obtained from the gas atomisation technique is characterised by a much coarser structure, which comprises a network of elongate plates, fibres and flakes many of which appear to be layered or fused together. Melt spinning appears to yield similar results. The BET value of these porous particle fragments was found to vary between 7 and 20 m$^2$/g. This material was also characterised using XRD as described herein and the 111 lattice spacing was measured as 3.145 Angstroms and the crystallite size was calculated to be 46 nm. The Seebeck coefficient, S, of these porous particle fragments at room temperature was measured as 57 µV/K. Using this value of S, the resistivity of the porous particle fragments was estimated using the procedure described herein to be in the range 0.0001 to 0.001 Ω-cm. The tap density of a sample of the fragments was 0.15 g/cm$^3$.

Porous particle fragments produced using method 1g of the present invention from hypereutectic alloy particles of size 90-150 µm and 30 wt % silicon were also characterised.

The BET value of such porous particle fragments was found to be between 12 and 14 m²/g, the 111 lattice spacing was measured as 3.142 Angstroms and the crystallite size was calculated to be 49 nm. The Seebeck coefficient, S, of these porous particle fragments at room temperature was measured as 53 μV/K. Using this value of S, the resistivity of the porous particle fragments was estimated using the procedure described herein to be in the range 0.0001 to 0.001 Ω-cm. The tap density of a sample of these fragments was 0.49 g/cm³.

Example 3—Preparation of Anode Mix and Electrode 10 g of the porous particle fragments from etched Si—Al material prepared as described above and containing less than 1% Al.

A composite electrode mix was prepared by mixing the etched porous particle fragments with a sodium polyacrylic acid binder and carbon black in the proportions 76:12:12 (Si:Polyacrylic acid:Carbon Black). The Si material and the Carbon black were high shear stirred as an aqueous solution for several hours.

The polyacrylic acid binder was added (as a 10 wt % solution in water) and the resulting composite was further mixed by a dual asymmetric centrifugation technique for 10 minutes and then cast onto electrodeposited Cu foil. Coat weights of 15-30 g/m2 are typically used for electrochemical testing in a Soft Pack Pair cell.

FIG. 4 is an SEM image of a composite anode mix prepared in the way described above using porous particle fragments prepared using method 1e. It was not possible to make a uniform composite mix using porous particle fragments prepared using method 1b with very high BET values of 70 m²/g.

Example 4—Preparation of Batteries

Electrode pieces were cut to the required size, and then dried overnight in a vacuum oven at 120° C., under dynamic vacuum. Slightly smaller pieces of standard lithium ion cathode material were prepared in a similar manner (active component either lithium cobalt oxide or a mixed metal oxide (MMO) i.e. $LiNi_{0.80}CO_{0.15}Al_{0.05}O_2$). Tags were ultrasonically welded to exposed areas of copper and aluminium on the two electrode pieces. Then the electrodes were wrapped between a continuous layer of porous polyethylene separator (Tonen), so that there was one layer of separator between the two electrodes. The winding was placed in an aluminium laminate bag, and the tags were thermally sealed along one edge. The cell was filled with the required quantity of electrolyte under partial vacuum, and the electrolyte was allowed to disperse into the pores. The bag was then vacuum sealed, and the cells were allowed to soak for a further thirty minutes before the start of cycle testing.

Example 5—Performance Data on Cells

Cells produced as described in Example 4 were cycled using Arbin battery cycling units using a constant capacity charge/discharge method. Discharge capacities close to either 1200 mAhr per gram of silicon or 1500 mAh/g was maintained over more than 100 cycles. FIGS. 3c and 3d show discharge capacities for a cell comprising an MMO cathode and produced using porous particle fragments prepared using method 1f and cycled at a constant capacity of 1200 mAh/g (FIG. 3c) or 1500 mAh/g (FIG. 3d) until the cell fails after 230 or 160 cycles respectively. FIG. 5 shows discharge capacities and coulombic efficiencies for a cell comprising a lithium cobalt oxide cathode and produced using porous particle fragments prepared using method 1e, cycled at a constant capacity of 1200 mAh/per gram of silicon until the cell started to fade around 110 cycles. Cells made using the coarser porous particle fragments prepared using method 1f with BET values of 7-20 m²/g cycled for more cycles and at a higher capacity than the cells made with porous particle fragments with a BET value of 40 m²/g.

Example 6—SEM Characterisation of Particles Produced Using the Gas Atomisation and Melt Spinning Techniques Scanning Electron Microscopy was carried out on fragment samples comprising 12 wt % or 30 wt % silicon and which had been fabricated using the gas atomisation and melt spinning cooling techniques. An alloy particle comprising 12 wt % Si produced by melt spinning was also characterised.

FIG. 6a illustrates that fragments produced from silicon aluminium alloys comprising 30 wt % silicon using a gas atomisation technique are characterised by a plurality of plate-like structures interspersed between a plurality of silicon nodules.

FIG. 7a illustrates that melt spinning a silicon aluminium alloy comprising 12 wt % silicon results in the formation of irregularly shaped disc and tube shaped structures.

FIG. 7b illustrates that porous particle fragments produced by etching and then partially crushing the structures illustrated in FIG. 7a produces a fragment structure comprising a mixture of fine and coarse elongate elements formed into branched dendritic or tree-like structures. The fragments were found to have a BET value of 10.51 to 15.97 m²/g.

The invention claimed is:
1. A composition comprising silicon-containing electroactive fractals derived from porous particles, each of said fractals having a volume and being selected from the group consisting of:
   a fractal having a substantially irregular shape or surface morphology, the fractal being derived from a silicon material originally defining or bounding pores or a network of pores within the porous particle; and
   a fractal having a substantially irregular shape or surface morphology, the fractal comprising a random or ordered network of linear, branched or layered elongate elements, the fractal being derived from a silicon material comprising a random or ordered network of linear, branched or layered elongate elements within the porous particle, wherein one or more discrete or interconnected voids or channels are defined between the elongate elements of the network,
wherein each of said fractals itself does not comprise pores, voids, channels, or a network of pores, voids or channels extending through the volume of the fractal;
wherein each of said fractals comprises at least one peak, trough, bump or ridge disposed over the surface thereof; has a spiky appearance; and/or has a ridged appearance;
wherein the composition optionally further comprises silicon-containing pore-containing fragments derived from porous particles, the pore-containing fragments comprising a network of pores, cavities and channels, which pores, cavities and channels are separated and defined by silicon-containing walls within the pore-containing fragment, and wherein fragments and fractals having an average pore wall thickness or an average fractal thickness in the range 50 nm to 2 μm comprise at least 50% of the volume of the fragments and fractals.

2. A composition according to claim 1, wherein the fractals have an average thickness in the range 0.05 to 2 μm.

3. A composition according to claim 1, wherein the silicon-containing fractals have an aspect ratio (length (largest diameter) to width (smallest diameter) of particle) in the range 2:1 to 5:1.

4. A composition according to claim 1, wherein at least 10 vol % of the fractals have a maximum overall dimension in the range 1 to 40 μm.

5. A composition according to claim 1, wherein the fractals comprise a fractal comprising at least one peak or ridge disposed over the surface thereof.

6. A composition according to claim 1, wherein the fractals comprise a fractal having a spiky appearance.

7. A composition according to claim 1, wherein the fractals comprise a fractal having a ridged appearance.

8. A composition according to claim 1, wherein the fractals have a BET surface area greater than 4 $m^2/g$ and less than 50 $m^2/g$.

9. A composition according to claim 1, which further comprises one or more components selected from a binder, a conductive material and optionally a non-silicon-containing electroactive material.

10. A composition, comprising 5 to 40 wt % of the silicon-containing electroactive material according to claim 1 and 60 to 95 wt % of an electroactive carbon material.

11. A composition according to claim 1, which further comprises one or more further silicon-containing components selected from the group consisting of silicon-containing particles having a minimal or negligible porosity; silicon-containing wires, nano-wires, fibres, rods, tubes, sheets, elongate bundles, substrate particles, scaffolds, ribbons and silicon-containing pillared particles.

12. A composition according to claim 1, wherein one or more of the silicon-containing fractals include a coating.

13. A composition according to claim 1, which is an electrode material.

14. A composition according to claim 1, which is in the form of a mat.

15. A method of making a composition according to claim 1, the method comprising providing silicon-containing whole porous particles having a porosity in the range 0.2 to 0.8 and an average pore wall thickness in the range 50 nm to 2 μm; fragmenting the silicon-containing whole porous particles to provide the silicon-containing fractals; and isolating the silicon-containing fractals.

16. A method according to claim 15, wherein the providing the silicon-containing whole porous particles comprises
forming a molten silicon aluminum alloy composition;
cooling the molten composition to give alloy particles; and
etching the alloy particles to provide the silicon-containing whole porous particles.

17. A method according to claim 16, wherein the molten composition is cooled at a rate of between $10^2$ and $10^5$ K/s.

18. A silicon-containing fragment prepared according to claim 16.

19. An electrode comprising a current collector and a composition according to claim 1.

20. An electrode according to claim 19, wherein the composition is in the form of a free standing felt or mat to which a current collector is connected.

21. An electrode according to claim 19, wherein the composition is in the form of a felt or mat having a mass per surface area of between 1 $mg/cm^2$ and 6 $mg/cm^2$ thereby to give a composite electrode having a thickness of from 10 to 100 μm.

22. A method of manufacturing an electrode according to claim 19 comprising the steps of forming a slurry of the composition according to claim 1 in a solvent, applying the slurry to a current collector and drying the product to remove the solvent.

23. A battery comprising a cathode, an anode comprising a composition according to claim 1 and an electrolyte.

24. A composition according to claim 1, wherein the composition further comprises silicon-containing pore-containing fragments derived from porous particles, the pore-containing fragments comprising a network of pores, cavities and channels, which pores, cavities and channels are separated and defined by silicon-containing walls within the pore-containing fragment.

25. A composition according to claim 24, wherein the ratio of the pore width to wall thickness in the pore-containing fragments is greater than 2.5:1.

26. A composition according to claim 24, characterized in that the pore-containing fragments comprise pores having a width in the range 100 nm to 10 μm.

27. A composition according to claim 24, wherein the ratio of the total volume of the pores in the pore-containing fragments to the total volume of the fragment is in the range 0.2 to 0.9.

28. A composition according to claim 1, wherein the composition optionally further comprises silicon-containing pore-containing fragments derived from porous particles, the pore-containing fragments comprising a network of pores, cavities and channels, which pores, cavities and channels are separated and defined by silicon-containing walls within the pore-containing fragment, and wherein fragments and fractals having an average pore wall thickness or an average fractal thickness in the range 50 nm to 2 μm comprise at least 70% of the volume of the fragments and fractals.

29. A composition according to claim 1, wherein the composition optionally further comprises silicon-containing pore-containing fragments derived from porous particles, the pore-containing fragments comprising a network of pores, cavities and channels, which pores, cavities and channels are separated and defined by silicon-containing walls within the pore-containing fragment, and wherein fragments and fractals having an a maximum overall dimension in the range of 1 to 40 μm comprise at least 50% of the volume of the fragments and fractals.

30. A composition according to claim 1, which comprises 50 to 90% of an electroactive material by weight, wherein the electroactive material comprises from 40 to 100% of the silicon-containing fractals by weight.

31. A method for making a composition according to claim 1, the method comprising:
forming porous particles using a method comprising at least one of:
i) a sol-gel formation method;
ii) injecting gases into a cooling molten mass comprising the electroactive material or alloy thereof; and
iii) etching particles comprising the electroactive material or an alloy thereof;
fragmenting the silicon-containing whole porous particles to provide the silicon-containing electroactive fractals; and
isolating the silicon-containing electroactive fractals.

32. A method according to claim 31, wherein forming the porous particles comprises forming a molten silicon aluminum alloy composition;
cooling the molten composition to give alloy particles; and
etching the alloy particles to provide silicon-containing whole porous particles having a porosity in the range 0.2 to 0.8 and an average pore wall thickness in the range 50 nm to 2 µm.

33. A method according to claim 31, wherein the silicon-containing porous particles are fragmented using one or more of milling, ultrasonication, high shear mixing and use of a pestle and mortar.

34. A composition according to claim 1, wherein each of said fractals comprises a linear or branched elongate element.

35. A composition according to claim 1, wherein
the fractal having a substantially irregular shape or surface morphology and being derived from the silicon material originally defining or bounding pores or a network of pores within the porous particle has an average thickness in the range 0.05 to 2 microns; and
in the fractal having a substantially irregular shape or surface morphology, and comprising the random or ordered network of linear, branched or layered elongate elements, and being derived from the silicon material comprising a random or ordered network of linear, branched or layered elongate elements within the porous particle, the network of linear, branched or layered elongate elements has an average thickness in the range 0.05 to 2 microns.

36. A composition comprising silicon-containing electroactive fractals, each of said fractals being selected from the group consisting of:
a fractal comprising a substantially irregular shape or surface morphology and an average thickness in the range 0.05 to 2 microns; and
a fractal comprising a network of linear, branched or layered elongate elements having an average thickness in the range 0.05 to 2 microns
wherein each of said fractals
itself does not comprise pores, channels or a network of pores or channels extending through the volume of the fractal; and
comprises at least one peak, trough, bump or ridge disposed over each surface thereof; has a spiky appearance; and/or has a ridged appearance; and
wherein at least 10 vol% of the fractals have a maximum overall dimension in the range 1 to 40 µm.

37. The composition of claim 36, wherein each of said fractals has an aspect ratio (length to width) in the range 2:1 to 5:1.

38. The method of claim 15, further comprising forming the silicon-containing whole porous particles by a sol-gel method or by injecting gases into a molten mass.

39. The method of claim 15, further comprising forming the silicon-containing whole porous particles by etching silicon or a silicon alloy.

40. The method of claim 15, wherein the fragmenting is performed by one or more of milling, ultrasonication, high-shear mixing, or use of a mortar and pestle.

* * * * *